US012808722B2

(12) United States Patent
Sakayori et al.

(10) Patent No.: US 12,808,722 B2
(45) Date of Patent: Nov. 24, 2026

(54) RESIN PANEL FOR INFRARED SENSOR, AND INFRARED SENSOR AND ARTICLE EMPLOYING SAID RESIN PANEL

(71) Applicant: DAI NIPPON PRINTING CO., LTD., Tokyo (JP)

(72) Inventors: Katsuya Sakayori, Fujimino (JP); Tomoki Yamagata, Kashiwa (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 123 days.

(21) Appl. No.: 18/847,999

(22) PCT Filed: Mar. 23, 2023

(86) PCT No.: PCT/JP2023/011443
§ 371 (c)(1),
(2) Date: Sep. 17, 2024

(87) PCT Pub. No.: WO2023/182412
PCT Pub. Date: Sep. 28, 2023

(65) Prior Publication Data

US 2025/0052620 A1 Feb. 13, 2025

(30) Foreign Application Priority Data

Mar. 24, 2022 (JP) ................................. 2022-048948
Jul. 7, 2022 (JP) ................................. 2022-109504

(51) Int. Cl.
*G01J 5/04* (2006.01)
*B32B 7/022* (2019.01)
(Continued)

(52) U.S. Cl.
CPC .............. *G01J 5/048* (2013.01); *B32B 7/022* (2019.01); *B32B 7/12* (2013.01); *B32B 27/08* (2013.01);
(Continued)

(58) Field of Classification Search
CPC ........... B32B 7/022; B32B 7/12; B32B 27/08; B32B 27/365; B32B 2255/10;
(Continued)

(56) References Cited

U.S. PATENT DOCUMENTS

2017/0129204 A1 5/2017 Mori
2018/0335505 A1 11/2018 Bretagnol et al.
(Continued)

FOREIGN PATENT DOCUMENTS

EP 4063197 A1 * 9/2022 ............. G02B 5/208
JP H04248422 A 9/1992
(Continued)

OTHER PUBLICATIONS

International Search Report issued for International Patent Application No. PCT/JP2023/011443, Date of mailing: Jun. 13, 2023, 7 pages including English translation.
(Continued)

*Primary Examiner* — Mark R Gaworecki
(74) *Attorney, Agent, or Firm* — HSML.P.C.

(57) ABSTRACT

Provided is a resin panel which, when applied as a protective cover of an infrared sensor, can inhibit an infrared sensor from being deteriorated in accuracy. A resin panel for an infrared sensor, the resin panel comprising a resin layer and a plastic film, as well as comprising a conductive layer and a pressure-sensitive adhesive layer between the resin layer and the plastic film, and satisfying at least one of the following expressions (1) and (2): 50 μm ≤thickness of the pressure-sensitive adhesive layer . . . (1); and $30 \leq T \times Y^3$ . . . (2); wherein "T" represents a thickness (unit: "μm") of the plastic film, and "Y" represents a Young's modulus (unit: "GPa") of the plastic film.

13 Claims, 4 Drawing Sheets

(51) Int. Cl.

| | |
|---|---|
| ***B32B 7/12*** | (2006.01) |
| ***B32B 27/08*** | (2006.01) |
| ***B32B 27/36*** | (2006.01) |
| ***G01J 5/08*** | (2022.01) |
| ***G01J 5/0875*** | (2022.01) |
| ***G02B 1/11*** | (2015.01) |
| ***G02B 5/22*** | (2006.01) |
| ***H10F 77/50*** | (2025.01) |

(52) U.S. Cl.
CPC .............. *B32B 27/365* (2013.01); *G01J 5/08* (2013.01); *G01J 5/0875* (2013.01); *G02B 1/11* (2013.01); *G02B 5/22* (2013.01); *H10F 77/50* (2025.01); *B32B 2255/10* (2013.01); *B32B 2255/20* (2013.01); *B32B 2255/205* (2013.01); *B32B 2307/40* (2013.01); *B32B 2307/416* (2013.01); *B32B 2307/54* (2013.01); *B32B 2307/7376* (2023.05)

(58) Field of Classification Search
CPC .......... B32B 2255/20; B32B 2255/205; B32B 2307/40; B32B 2307/416; B32B 2307/54; B32B 2307/7376; G01J 5/048; G01J 5/08; G01J 5/0875; G02B 1/11; G02B 5/22; H10F 77/50
See application file for complete search history.

(56) References Cited

U.S. PATENT DOCUMENTS

| | | | |
|---|---|---|---|
| 2019/0162887 | A1 | 5/2019 | Shimizu et al. |
| 2022/0404199 | A1 | 12/2022 | Koyama et al. |

FOREIGN PATENT DOCUMENTS

| | | | |
|---|---|---|---|
| JP | 2016009071 | A | 1/2016 |
| JP | 2018101016 | A | 6/2018 |
| JP | 2019032505 | A | 2/2019 |
| JP | 2019100792 | A | 6/2019 |
| JP | 2019156129 | A | 9/2019 |
| JP | 2021081596 | A | 5/2021 |
| JP | 20210081698 | A | 5/2021 |
| WO | 2018052057 | A1 | 3/2018 |
| WO | 2020247293 | A1 | 12/2020 |
| WO | 2021100798 | A1 | 5/2021 |

OTHER PUBLICATIONS

Written Opinion issued for International Patent Application No. PCT/JP2023/011443, Date of mailing: Jun. 13, 2023, 8 pages including English translation.

Extended European Search Report issued for European Patent Application No. 23775006.2, dated Jan. 20, 2026, 9 pages.

* cited by examiner

[Fig. 1]
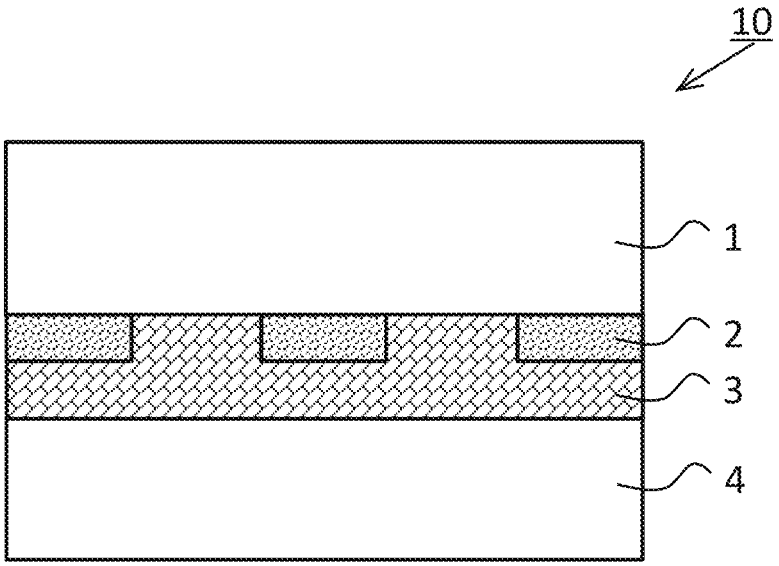
[Fig. 2]
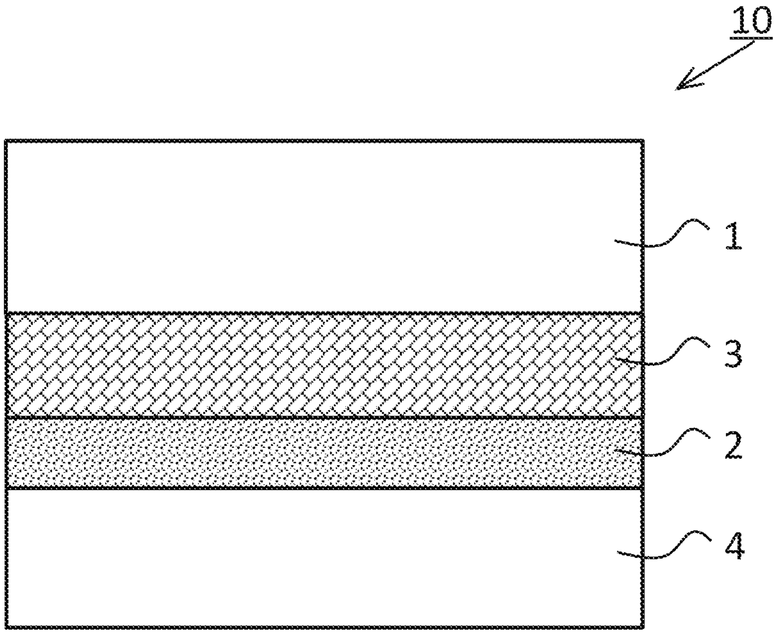

[Fig. 3]
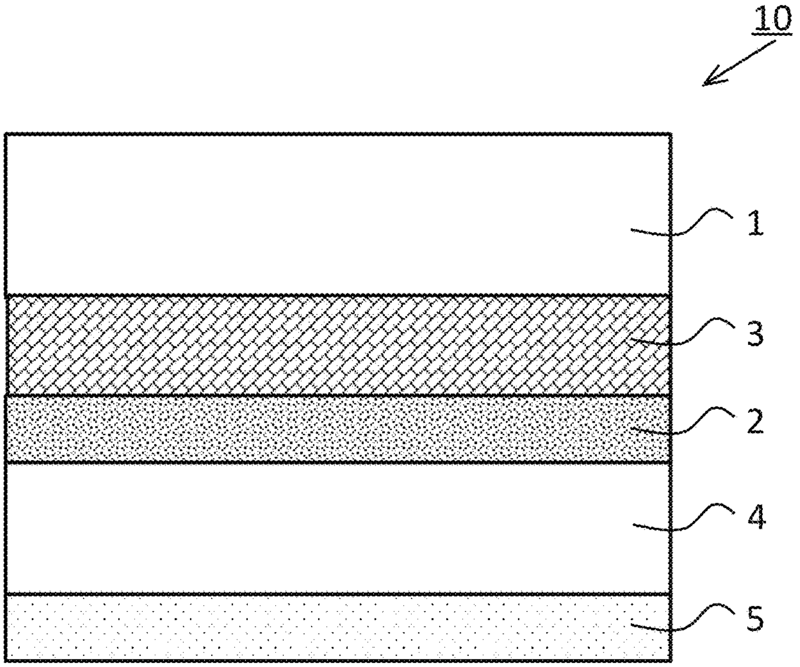
[Fig. 4]
(A)
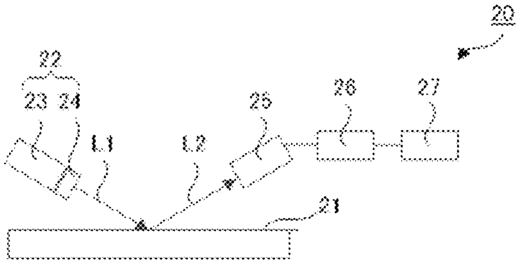
(B)
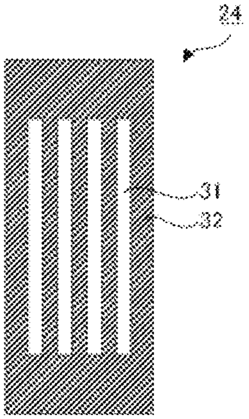

[Fig. 5]
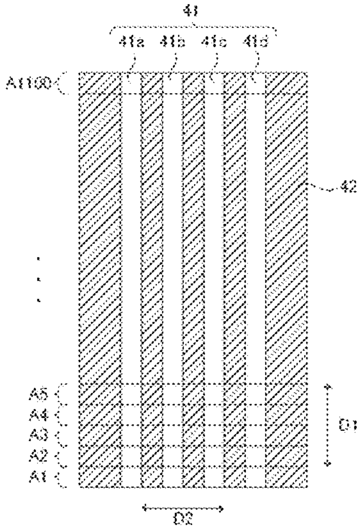
[Fig. 6]
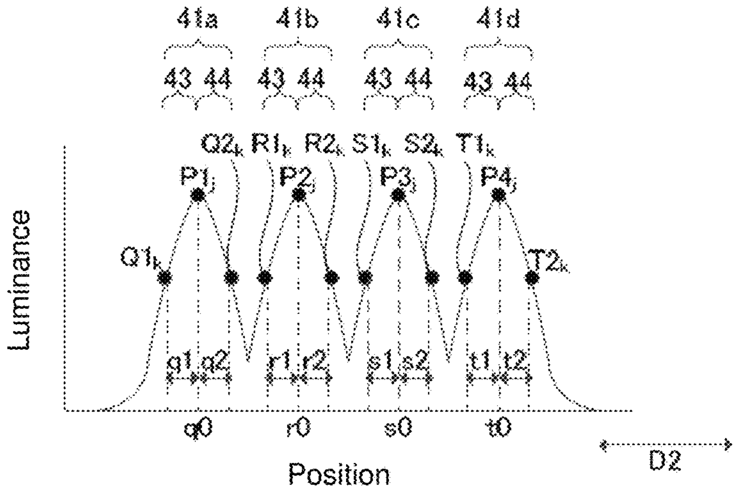
[Fig. 7]
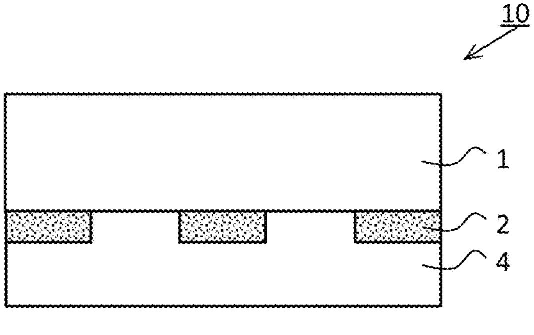

[Fig. 8]
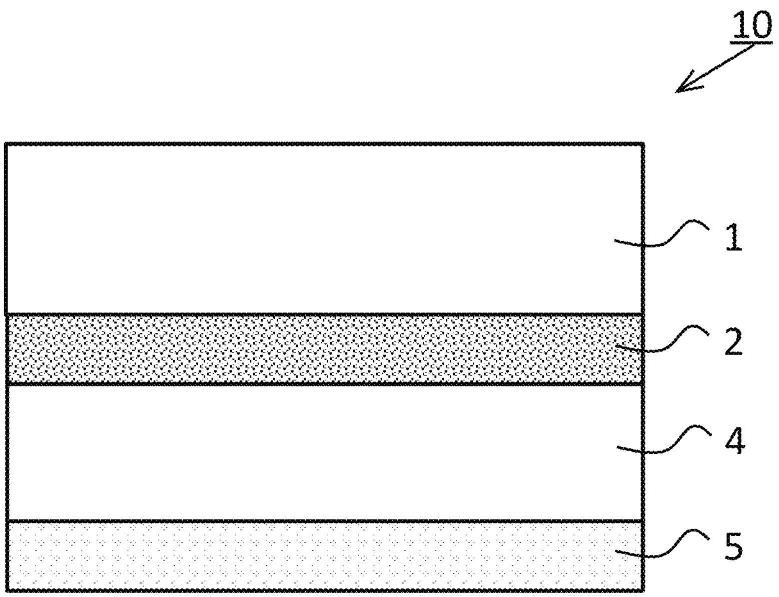

RESIN PANEL FOR INFRARED SENSOR, AND INFRARED SENSOR AND ARTICLE EMPLOYING SAID RESIN PANEL

TECHNICAL FIELD

The present disclosure relates to a resin panel for an infrared sensor, and an infrared sensor and an article each using the resin panel.

BACKGROUND ART

Recently, technological development of optical sensors such as LiDAR has been advancing in the field of, for example, automatic driving of automobiles. In such an optical sensor, there is a case where a protective cover is disposed in front of a light emitting element and a light receiving element.

The protective cover for optical sensors is formed, for example, to protect the light emitting element and the light receiving element from stepping stones, sunlight, rain and wind, and the like. Such protective covers have been proposed as protective covers in, for example, PTLs 1 and 2. The protective cover of PTL 2 is a protective cover for an optical sensor comprising a light emitting element having a light-emitting wavelength in the infrared region.

CITATION LIST

Patent Literatures

PTL 1: JP 2019-32505 A
PTL 2: WO 2021/100798

SUMMARY OF INVENTION

Technical Problem

An optical sensor may be used in various natural environments. Therefore, a protective cover of such an optical sensor is preferably equipped with a measure for dew condensation. Such measures for dew condensation include application of an anti-fogging coating as disclosed in PTL 1 and coating with a water repellent as disclosed in PTL 2.

However, such measures in PTLs 1 and 2, and the like are insufficient in dew condensation prevention performance in a severe natural environment. It is preferable for stable prevention of dew condensation to form a conductive layer in a protective cover and generate heat in the protective cover by energization.

However, in the case where a conductive layer is added to a protective cover, a problem frequently caused is that an optical sensor is deteriorated in accuracy. Examples of the problems caused due to deterioration in accuracy of an optical sensor include the problem caused by diffusion of laser light and the problem of the occurrence of the variation in intensity of laser light.

An object of the present disclosure is to provide a resin panel which, when applied as a protective cover of an infrared sensor, can inhibit an infrared sensor from being deteriorated in accuracy, and an infrared sensor and an article each using the resin panel.

Solution to Problem

In order to achieve the above object, the present disclosure provides the following <1> to <24>.

<1> A resin panel for an infrared sensor, the resin panel comprising a resin layer and a plastic film, as well as comprising a conductive layer and a pressure-sensitive adhesive layer between the resin layer and the plastic film, and satisfying at least one of the following expressions (1) and (2):

$$50\ \mu m \leq \text{thickness of the pressure-sensitive adhesive layer} \quad (1)$$

$$30 \leq T \times Y^3 \quad (2)$$

wherein "T" represents a thickness (unit: "µm") of the plastic film, and "Y" represents a Young's modulus (unit: "GPa") of the plastic film.

<2> The resin panel for an infrared sensor according to <1>, wherein $T \times Y^3$ in the expression (2) is in a range from 30 to 50000.

<3> The resin panel for an infrared sensor according to <1> or <2>, wherein the resin panel comprises the resin layer, the conductive layer, the pressure-sensitive adhesive layer, and the plastic film in this order.

<4> The resin panel for an infrared sensor according to <3>, wherein the conductive layer is formed into a pattern.

<5> The resin panel for an infrared sensor according to <4>, wherein a thickness of the conductive layer is in a range from 2 µm to 30 µm.

<6> The resin panel for an infrared sensor according to <1> or <2>, wherein the resin panel comprises the resin layer, the pressure-sensitive adhesive layer, the conductive layer, and the plastic film in this order.

<7> The resin panel for an infrared sensor according to <6>, wherein the conductive layer is formed on a whole surface of the resin panel.

<8> The resin panel for an infrared sensor according to <7>, wherein a thickness of the conductive layer is in a range from 10 nm to 300 nm.

<9> The resin panel for an infrared sensor according to <7> or <8>, wherein the conductive layer is a conductive fiber-containing layer, and a difference in thickness of the conductive fiber-containing layer is 50 nm or less.

<10> The resin panel for an infrared sensor according to any of <1> to <9>, wherein the expression (2) is satisfied, and a thickness of the pressure-sensitive adhesive layer is in a range from 5 µm to 100 µm.

<11> A resin panel for an infrared sensor, the resin panel comprising a resin layer and a plastic film, as well as comprising a conductive layer between the resin layer and the plastic film, and satisfying the following expression (3):

$$30 \leq T \times Y^3 \quad (3)$$

wherein "T" represents a thickness (unit: "µm") of the plastic film, and "Y" represents a Young's modulus (unit: "GPa") of the plastic film.

<12> The resin panel for an infrared sensor according to <11>, wherein $T \times Y^3$ in the expression (3) is in a range from 30 to 50000.

<13> The resin panel for an infrared sensor according to <11> or <12>, wherein the conductive layer is formed into a pattern.

<14> The resin panel for an infrared sensor according to <13>, wherein a thickness of the conductive layer is in a range from 2 μm to 30 μm.

<15> The resin panel for an infrared sensor according to <11>, wherein the conductive layer is formed on a whole surface of the resin panel.

<16> The resin panel for an infrared sensor according to <15>, wherein a thickness of the conductive layer is in a range from 10 nm to 300 nm.

<17> The resin panel for an infrared sensor according to <15> or <16>, wherein the conductive layer is a conductive fiber-containing layer, and a difference in thickness of the conductive fiber-containing layer is 50 nm or less.

<18> The resin panel for an infrared sensor according to any of <1> to <17>, wherein a thickness of the resin layer is in a range from 0.5 mm to 5.0 mm.

<19> The resin panel for an infrared sensor according to any of <1> to <18>, comprising an antireflection layer on at least one of a surface of the resin layer, the surface being on the other side than the side provided with the plastic film, and a surface of the plastic film, the surface being on the other side than the side provided with the resin layer.

<20> The resin panel for an infrared sensor according to any of <1> to <19>, wherein the resin layer has a curved surface having a radius of curvature of 1000 mm or more.

<21> The resin panel for an infrared sensor according to any of <1> to <20>, wherein the resin panel has a light transmittance at a wavelength of 905 nm of 75% or more.

<22> The resin panel for an infrared sensor according to any of <1> to <21>, wherein an image definition in transmission at an optical comb width of 0.25 mm, in the resin panel, is 65% or more, as measured according to JIS K7374:2007.

<23> An infrared sensor comprising an infrared light emitting element, an infrared light receiving element, and a protective cover disposed in front of the infrared light emitting element and the infrared light receiving element, wherein the protective cover is the resin panel according to any of <1> to <22>.

<24> An article equipped with the infrared sensor according to <23>.

Advantageous Effects of Invention

The resin panel of the present disclosure, when applied as a protective cover for an infrared sensor, can allow the infrared sensor to fully function. The infrared sensor and the article of the present disclosure each using the resin panel can allow the infrared sensor to fully function.

BRIEF DESCRIPTION OF DRAWINGS

FIG. 1 is a cross-sectional view showing one embodiment of the resin panel for an infrared sensor of the present disclosure.

FIG. 2 is a cross-sectional view showing another embodiment of the resin panel for an infrared sensor of the present disclosure.

FIG. 3 is a cross-sectional view showing another embodiment of the resin panel for an infrared sensor of the present disclosure.

FIG. 4 shows a schematic view of a surface texture measurement apparatus and a schematic plan view showing an example of a mask constituting an illumination part.

FIG. 5 is a view showing an example of an image taken with an imager in a surface texture measurement apparatus.

FIG. 6 is a graph representing an example of a light intensity distribution of reflected light on a surface to be measured.

FIG. 7 is a cross-sectional view showing another embodiment of the resin panel for an infrared sensor of the present disclosure.

FIG. 8 is a cross-sectional view showing another embodiment of the resin panel for an infrared sensor of the present disclosure.

DESCRIPTION OF EMBODIMENTS

[Resin Panel of First Embodiment]

A resin panel for an infrared sensor of a first embodiment of the present disclosure is a resin panel, the resin panel comprising a resin layer and a plastic film, as well as comprising a conductive layer and a pressure-sensitive adhesive layer between the resin layer and the plastic film, and satisfying at least one of the following expressions (1) and (2):

$$50\ \mu m \leq \text{Thickness of the pressure-sensitive adhesive layer} \quad (1)$$

$$30 \leq T \times Y^3 \quad (2)$$

wherein "T" represents the thickness (unit: "μm") of the plastic film, and "Y" represents the Young's modulus (unit: "GPa") of the plastic film.

FIGS. 1 to 3 are each a cross-sectional view showing one embodiment of the resin panel of the first embodiment of the present disclosure.

A resin panel 10 in each of FIGS. 1 to 3 comprises a resin layer 1 and a plastic film 4, as well as comprises a conductive layer 2 and a pressure-sensitive adhesive layer 3 between the resin layer 1 and the plastic film 4.

The resin panel 10 in FIG. 1 comprises the resin layer 1, the conductive layer 2, the pressure-sensitive adhesive layer 3, and the plastic film 4 in this order. The conductive layer 2 in FIG. 1 is formed into a pattern.

The resin panel 10 in each of FIGS. 2 and 3 comprises the resin layer 1, the pressure-sensitive adhesive layer 3, the conductive layer 2, and the plastic film 4 in this order. The resin panel 10 in FIG. 3 comprises an antireflection layer 5 on a surface of the plastic film 4, the surface being on the other side than the side provided with the resin layer. The conductive layer 2 in each of FIGS. 2 and 3 is formed on the whole surface of the resin panel 10.

<Lamination Configuration>

A lamination configuration of the resin panel of the first embodiment may comprise a resin layer, a conductive layer, a pressure-sensitive adhesive layer, and a plastic film in this order as in FIG. 1, or may comprise a resin layer, a pressure-sensitive adhesive layer, a conductive layer, and a plastic film in this order as in FIG. 2. The lamination configuration of the resin panel of the first embodiment is not limited to the lamination configurations in FIGS. 1 and 2. For example, the resin panel of the first embodiment may further comprise an additional plastic film (not shown).

The lamination configuration in FIG. 1 may be referred to as "first lamination configuration", and the lamination configuration in FIG. 2 may be referred to as "second lamination configuration".

<Expressions (1) and (2)>

The resin panel of the first embodiment of the present disclosure is required to satisfy at least one of the following expressions (1) and (2):

$$50\ \mu m \leq \text{Thickness of pressure-sensitive adhesive layer} \quad (1)$$

$$30 \leq T \times Y^3 \quad (2)$$

wherein "T" represents the thickness (unit: "μm") of the plastic film, and "Y" represents the Young's modulus (unit: "GPa") of the plastic film.

The thickness in a surface of the pressure-sensitive adhesive layer is difficult to completely uniform, and is usually varied slightly in the surface. The variation in thickness of the pressure-sensitive adhesive layer is then easily amplified by application of stress to the pressure-sensitive adhesive layer in a step of bonding the resin layer and the plastic film with the pressure-sensitive adhesive layer being interposed. In particular, in the case where the resin layer has a curved surface, the variation in thickness of the pressure-sensitive adhesive layer is more easily amplified. When the variation in thickness of the pressure-sensitive adhesive layer is amplified, the variation is also easily reflected on a surface of the plastic film, and thus irregularities occur on the surface of the plastic film. When the variation in thickness of the pressure-sensitive adhesive layer is thus amplified to cause the occurrence of irregularities on the surface of the plastic film, the variation in infrared transmissivity in a surface of the resin panel occurs to result in deterioration in accuracy of an infrared sensor.

The above amplification of the variation in thickness of the pressure-sensitive adhesive layer can be decreased by an increase in thickness of the pressure-sensitive adhesive layer. Therefore, when the expression (1) is satisfied, deterioration in accuracy of an infrared sensor can be suppressed.

If the expression (2) is satisfied, the variation in thickness of the pressure-sensitive adhesive layer is hardly reflected on the surface of the plastic film. Therefore, even if the expression (1) is not satisfied, the expression (2) can be satisfied to inhibit irregularities from occurring on the surface of the plastic film, thereby allowing for suppression of deterioration in accuracy of an infrared sensor.

Examples of the problem caused by deterioration in accuracy of an optical sensor include the problem caused by diffusion of laser light and the problem caused by the variation in intensity of laser light.

The problem caused by diffusion of laser light is, for example, the problem of a reduction in intensity of laser light returned to an infrared light receiving element due to diffusion of laser light, to the detection threshold or less.

The problem caused by the variation in intensity of laser light is, for example, the problem of no exact distance measurement data obtained. The reason for this problem is considered because the light intensity distribution of laser light is varied to cause inclusion of laser light exhibiting the detection threshold or less depending on a detection position, in laser light returned to an infrared light receiving element.

The reason why the Young's modulus Y is raised to the third power in the expression (2) is because, while the Young's modulus is a one-dimensional parameter with a sample pulled in one direction, irregularities occurring on the surface of the plastic film have a three-dimensional form.

The reason why the thickness of the plastic film is multiplied with the cube of the Young's modulus in the expression (2) is because the respective lengths in the X-axis direction and the Y-axis direction of the plastic film are fully long as compared with the length in the Z-axis direction being the thickness direction of the plastic film. In more explanation, while the respective lengths in the X-axis direction and the Y-axis direction of the plastic film are fully long and thus the deformations in the X-axis direction and the Y-axis direction of the plastic film are easily relaxed, the length in the Z-axis direction of the plastic film is short and thus the deformation in the thickness direction of the plastic film is hardly relaxed. Therefore, the length in the Z-axis direction in which the deformation is hardly relaxed is multiplied with the cube of the Young's modulus.

Both the expression (1) and the expression (2) are preferably satisfied in order to more suppress irregularities on the surface of the plastic film.

There will be described later a preferred embodiment of the thickness of the pressure-sensitive adhesive layer and a preferred embodiment of the thickness of the plastic film.

<Resin Layer>

The resin layer preferably contains a resin as a main component.

The main component means a component that accounts for 50% by mass or more, preferably 70% by mass or more, and more preferably 90% by mass or more of the total solid content of the resin layer.

The resin of the resin layer may be a curable resin such as a thermosetting resin and an ionizing radiation-curable resin, and is preferably a thermoplastic resin for the purpose of processability in curved surface processing or the like.

Examples of the thermoplastic resin include a single resin selected from the group consisting of a polystyrene-based resin, a polyolefin-based resin, an ABS resin, an AS resin, an AN resin, a polyphenyleneoxide-based resin, a polycarbonate-based resin, a polyacetal-based resin, an acrylic resin, a polyester-based resin such as a polyethylene terephthalate-based resin, a polybutylene terephthalate-based resin, a polysulfone-based resin, and a polyphenylenesulfide-based resin, and mixtures thereof. Among them, a polycarbonate-based resin and an acrylic resin are preferable, and a polycarbonate-based resin, which is excellent in impact resistance, is more preferable.

A biomass-derived resin may be contained as the resin of the resin layer. Examples of the biomass-derived resin include a polyester-based resin with biomass-derived ethylene glycol as a raw material, a polyethylene-based resin with biomass-derived ethylene as a raw material, and a resin with biomass-derived isosorbide as a raw material. Examples of the resin with the isosorbide as a raw material include "DURABIO (trademark)" of Mitsubishi Chemical Corporation.

The resin layer may contain a colorant.

The colorant may be any of a dye and a pigment, and is preferably a pigment in order to provide good weather resistance. The pigment preferably has an average particle diameter of 0.1 μm or less. The colorant may be used singly or in combinations of two or more kinds thereof.

Herein, the respective average particle diameters of particles of the colorant, low refractive index particles and high refractive index particles are each calculated by the following workings A1 to A3, unless particularly mentioned.

A1: A cross section of the resin panel is imaged with a STEM (scanning transmission electron microscope). The acceleration voltage and the magnification in STEM are preferably 10 kV or more and 30 kV or less, and 50000× or more and 300000× or less, respectively.

A2: Any 10 particles are extracted from an observation image and the diameter of each of the particles is calculated. Such a particle diameter is measured by sandwiching a cross section of each of the particles between any parallel two straight lines and measuring the distance between such two straight lines in a combination of such two straight lines providing the maximum distance between such two straight lines.

A3: The same working is performed five times in an observation image in another screen, of the same sample, and the value obtained from the number average particle diameter of 50 particles in total is defined as the average particle diameter of such particles.

The description "Herein, AAA" is a common description to the first embodiment and the second embodiment, unless particularly mentioned.

Herein, a cross section photograph of the resin panel can be taken by producing a sample in which a vertical cross-section of the resin panel is exposed, and using the sample.

The sample is produced according to the following steps (A1) to (A2).

(A1) A cut sample is produced by cutting the resin panel to any size, and then an embedded sample in which the cut sample is embedded in the resin is produced.

(A2) The embedded sample is vertically cut with a microtome to produce a sample in which a cross section of the resin panel is exposed.

The colorant is preferably a colorant through which infrared light easily passes and visible light hardly passes. The colorant through which infrared light easily passes and visible light hardly passes is preferable in that the visible light transmittance, the light transmittance at a wavelength of 905 nm, and the like of the resin panel are easily within ranges described later.

Examples of the colorant through which infrared light easily passes and visible light hardly passes include an azomethineazo-based compound, a perylene-based compound, and a bisbenzofuranone-based compound. The azomethineazo-based compound, the perylene-based compound, and the bisbenzofuranone-based compound can be each used in the form of a pigment.

The colorant through which infrared light easily passes and visible light hardly passes is also preferably mixed with a colorant generally used and then used. Such a colorant generally used can be mixed to facilitate adjustment of the color of the resin layer and an enhancement in design of the resin panel.

The azomethineazo-based compound is an azo-based compound having an azomethine group. Examples of the azo-based compound having an azomethine group include a compound having an azo group that has a structural unit represented by general formula (1) below within its molecule.

The azomethineazo-based compound can be produced by procedures described in JP S63-91283 A and JP S62-32149 A, for example.

Examples of the azomethineazo-based compound also include a compound having a diazonium group, which is a compound obtained through reaction between tetrachlorophthalimide and aminoaniline.

(1)

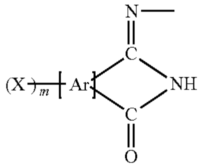

wherein "Ar" is a residual group of an aromatic compound or a heterocyclic compound, "X" is a hydrogen atom or a halogen atom, and "m" is an integer of 1 or more resulting from the substitution position of Ar. It is preferable that "m" be an integer of 1 to 4.

The perylene-based compound is a compound having a structure in which two oxygen atoms in the six-membered rings of perylenetetracarboxylic dianhydride are removed, and examples thereof include perylene black.

Examples of the bisbenzofuranone-based compound include compounds respectively having structures represented by general formulae (I) to (III), in WO 2019/230684.

The content of the colorant in the resin layer is preferably adjusted by the thickness of the resin layer, the compositional ratio of another layer, and the like. In one example, the content of the colorant in the resin layer is preferably 0.05% by mass or more and 50% by mass or less, and more preferably 0.1% by mass or more and 30% by mass or less of the total solid content of the resin layer.

The lower limit of the thickness of the resin layer is preferably 0.5 mm or more, and more preferably 1.0 mm or more, in order to provide good strength of the resin panel, and is preferably 5.0 mm or less, and more preferably 3.0 mm or less, in order to inhibit the thickness from being increased.

An embodiment of a suitable range of the thickness of the resin layer is, for example, a range from 0.5 mm to 5.0 mm, a range from 0.5 mm to 3.0 mm, a range from 1.0 mm to and 5.0 mm, or a range from 1.0 mm to 3.0 mm.

Herein, the thickness of the resin layer is calculated by subtracting the total thickness of other layers than the resin layer, from the total thickness of the resin panel. Herein, the total thickness of the resin panel means one obtained by measuring the thicknesses at any 20 points with a contact type thickness measuring instrument and determining the average value of the thicknesses at 18 points, except for the maximum value and the minimum value.

Herein, the thickness of other layers than the resin layer means one obtained by taking a cross section photograph of the resin panel with a scanning transmission electron microscope, measuring the thicknesses at any 20 points, and determining the average value of the thicknesses at 18 points, except for the maximum value and the minimum value.

The atmosphere for measurement of the thickness is at a temperature of 23±5 °C and a relative humidity in a range of 40% to 65%. A subject sample is exposed to the atmosphere for 30 minutes to 60 minutes before measurement of the thickness.

The resin layer preferably has a curved surface in order to provide good design.

In the case where the resin layer has a curved surface, the variation in thickness of the pressure-sensitive adhesive layer is easily amplified when the resin layer and the plastic film are bonded with the pressure-sensitive adhesive layer being interposed. However, even if the resin panel of the present disclosure comprises the resin layer, which has a curved surface, the variation in thickness of the pressure-sensitive adhesive layer can be inhibited from being amplified and therefore irregularities can be easily inhibited from occurring on the surface of the plastic film.

The resin layer preferably has a curved surface having a radius of curvature of 1000 mm or more.

When the radius of curvature of the curved surface is 1000 mm or more, good workability of bonding between the resin layer and the plastic film can be provided and irregularities can be easily inhibited from occurring on the surface of the plastic film.

The radius of curvature of the curved surface is more preferably 2000 mm or more.

Herein, the radius of curvature of the curved surface means one obtained by measuring the radii of curvature at any 5 points on the curved surface and determining the average value of the radii of curvature at such 5 points, except for the maximum value and the minimum value. The radius of curvature can be measured with, for example, a 3D shape measuring machine from Keyence Corporation.

<Plastic Film>

Examples of the resin constituting the plastic film include one or more selected from the group consisting of resins, for example, polyolefin-based resins such as polyethylene and polypropylene; vinyl-based resins such as polyvinyl chloride, polyvinylidene chloride, polyvinyl alcohol, an ethylene-vinyl acetate copolymer, and an ethylene-vinyl alcohol copolymer; polyester-based resins such as polyethylene terephthalate, polyethylene naphthalate, and polybutylene terephthalate; acrylic resins such as polymethyl (meth)acrylate and polyethyl (meth)acrylate; styrene-based resins such as polystyrene; and polyamide-based resins such as nylon 6 and nylon 66. The resin constituting the plastic film may be a biomass-derived resin. The plastic film may be any of an un-stretched film, a uniaxially stretched film, and a biaxially stretched film.

Among these plastic films, a biaxially stretched polyester firm is preferable in view of heat resistance and dimension stability, and an acrylic film, a polycarbonate film, or a co-extruded film of an acrylic resin and polycarbonate is preferable in view of weather resistance.

In order to easily inhibit irregularities from occurring on the surface of the plastic film, $T \times Y^3$ in the expression (2) in the plastic film is more preferably 33 or more, more preferably 40 or more, more preferably 45 or more, more preferably 50 or more, more preferably 60 or more, more preferably 80 or more, more preferably 120 or more, and more preferably 150 or more. $T \times Y^3$ is preferably 45 or more, in order to more easily inhibit deterioration in accuracy of an infrared sensor due to diffusion of laser light.

If $T \times Y^3$ is a too large value, cracking easily occurs in bending of the plastic film. Therefore, $T \times Y^3$ is preferably 50000 or less, more preferably 41000 or less, and more preferably 25000 or less.

An embodiment of a suitable range of $T \times Y^3$ is, for example, in a range from 30 to 50000, in a range from 30 to 41000, in a range from 30 to 25000, in a range from 33 to 50000, in a range from 33 to 41000, in a range from 33 to 25000, in a range from 40 to 50000, in a range from 40 to 41000, in a range from 40 to 25000, in a range from 45 to 50000, in a range from 45 to 41000, in a range from 45 to 25000, in a range from 50 to 50000, in a range from 50 to 41000, in a range from 50 to 25000, in a range from 60 to 50000, in a range from 60 to 41000, in a range from 60 to 25000, in a range from 80 to 50000, in a range from 80 to 410000, in a range from 80 to 25000, in a range from 120 to 50000, in a range from 120 to 41000, in a range from 120 to 25000, in a range from 150 to 50000, in a range from 150 to 41000, or in a range from 150 to 25000.

In the case where the expression (1) is satisfied, $T \times Y^3$ may be less than 30.

The Young's modulus of the plastic film is preferably 1.3 GPa or more, more preferably 1.5 GPa or more, and more preferably 2.0 GPa or more, in order that the expression (2) is easily satisfied.

If the Young's modulus of the plastic film is too large, cracking easily occurs in bending of the plastic film. Therefore, the Young's modulus of the plastic film is preferably 9.0 GPa or less, more preferably 8.0 GPa or less, and more preferably 7.0 GPa or less.

An embodiment of a suitable range of the Young's modulus of the plastic film is, for example, 1.3 GPa or more and 9.0 GPa or less, 1.3 GPa or more and 8.0 GPa or less, 1.3 GPa or more and 7.0 GPa or less, 1.5 GPa or more and 9.0 GPa or less, 1.5 GPa or more and 8.0 GPa or less, 1.5 GPa or more and 7.0 GPa or less, 2.0 GPa or more and 9.0 GPa or less, 2.0 GPa or more and 8.0 GPa or less, or 2.0 GPa or more and 7.0 GPa or less.

The Young's modulus of the plastic film can be adjusted by, for example, the draw ratio of the film, the temperature during stretching, and the speed during stretching. A higher draw ratio of the film tends to result in a higher Young's modulus. A higher temperature during stretching tends to result in a lower Young's modulus. A lower speed during stretching tends to result in a higher Young's modulus.

Herein, the Young's modulus of the plastic film is defined as the average value of 10 samples subjected to measurement under the following conditions.

Here, in the case where the plastic film has a slow axis, five first samples each having a length of 150 mm in a slow axis direction are produced and five second samples each having a length of 150 mm in a direction perpendicular to the slow axis are produced. The average value of 10 samples in total of the first samples and the second samples is defined as the Young's modulus of the plastic film. The "slow axis" means a direction in which the highest refractive index in the surface of the plastic film is achieved. The slow axis of the plastic film can be determined by a procedure described later.

Each of the samples is exposed to an atmosphere at the following temperature and relative humidity for 30 minutes to 60 minutes before measurement of the Young's modulus.

The measurement apparatus of the Young's modulus is, for example, a Tensilon universal testing machine (product name "RTC-1310A", manufactured by Orientec Co., Ltd.).

<Measurement Conditions of Young's Modulus>

Measured according to JIS K7127:1999

Size of sample: Strip shape of 2 mm×150 mm

Distance between chucks: 50 mm

Tensile speed: 25 mm/min

Temperature in measurement: 23 °C.

Relative humidity in measurement: in a range from 40% to 60%

The slow axis of the plastic film is measured with a phase difference measurement apparatus. In the case where trade name "RETS-100" from Otsuka Electronics Co., Ltd. is used as the phase difference measurement apparatus, measurement can be made by the following procedure.

(A1) First, the light source RETS-100 is turned on and then left to still stand for 60 minutes or more for the purpose of stabilization of the light source. Thereafter, not only a rotating analyzer method is selected, but also a θ mode (mode for phase difference measurement in the angle direction and Rth calculation) is selected. The 0 mode is selected to provide an inclined rotation stage as a stage.

(A2) Next, the following measurement conditions are input to RETS-100.

(Measurement Conditions)

Retardation measurement range: rotating analyzer method
Spot diameter in measurement: 5 mm in diameter
Inclination angle range: 0°
Wavelength range in measurement: 400 nm to 800 nm
Average refractive index of plastic film (for example, N=1.617 in case of PET film)
Thickness of plastic film (A3) Thereafter, the background data is obtained without any sample installed on the apparatus. The apparatus is in a closed system, and this operation is performed every lighting of the light source.

(A4) Subsequently, each sample is installed on the stage in the apparatus, and measurement of the slow axis direction is performed. The size of each sample is 160 mm×160 mm. The measurement of the slow axis direction is made with respect to each sample at any 5 points.

The average with respect to the slow axis direction at three points, except for the maximum value and the minimum value, is defined as the slow axis direction with respect to each sample.

(Note: the slow axis angle measured with RETS-100 represents the difference in angle between a reference direction in which each sample is installed and a direction in which the highest refractive index is obtained (slow axis direction), under the assumption that the reference direction corresponds to 0°. Therefore, in the case where a plurality of samples is subjected to measurement, these samples are required to be installed in the same direction on the stage.)

It is difficult to clearly release only the plastic film from the resin panel. The pressure-sensitive adhesive layer and/or the conductive layer have/has almost no effect on the Young's modulus. Therefore, the Young's modulus of the plastic film may be herein measured in the state where the pressure-sensitive adhesive layer and/or the conductive layer remain(s) on the plastic film.

The thickness of the plastic film is preferably 10 μm or more, more preferably 15 μm or more, more preferably 25 μm or more, more preferably 38 μm or more, more preferably 50 μm or more, and more preferably 75 μm or more. As the thickness of the plastic film is increased, deterioration in accuracy of an infrared sensor due to thin film interference can be easily suppressed. The thickness of the plastic film is preferably 100 μm or more, and more preferably 125 μm or more, in order to suppress deformation due to heat in insert molding.

If the thickness of the plastic film is too large, workability of bonding to the resin layer may be deteriorated. Therefore, the thickness of the plastic film is preferably 188 μm or less, more preferably 125 μm or less, and further preferably 100 μm or less. The thickness of the plastic film is preferably 250 μm or less, and more preferably 200 μm or less, in order to easily provide good shape followability in insert molding.

In the case of the first embodiment, a suitable range of the thickness of the plastic film is, for example, a range from 10 μm to 188 μm, a range from 10 μm to 125 μm, a range from 10 μm to 100 μm, a range from 15 μm to 188 μm, a range from 15 μm to 125 μm, a range from 15 μm to 100 μm, a range from 25 μm to 188 μm, a range from 25 μm to 125 μm, a range from 25 μm to 100 μm, a range from 10 μm to 188 μm a range from 38 μm to 188 μm, a range from 38 μm to 125 μm, a range from 38 μm to 100 μm, a range from 50 μm to 188 μm, a range from 50 μm to 125 μm, a range from 50 μm to 100 μm, a range from 75 μm to 188 μm, a range from 75 μm to 125, or a range from 75 μm to 100 μm.

In the case of the second embodiment, a suitable range of the thickness of the plastic film is, for example, a range from 100 μm to 250 μm, a range from 100 am to 220 μm, a range from 125 μm to 250 μm, or a range from 125 μm to 220 μm.

<Pressure-Sensitive Adhesive Layer>

The pressure-sensitive adhesive layer can be formed from, for example, a pressure-sensitive adhesive generally used, such as an acrylic pressure-sensitive adhesive, a urethane-based pressure-sensitive adhesive, a silicone-based pressure-sensitive adhesive or a rubber-based pressure-sensitive adhesive. Among them, an acrylic pressure-sensitive adhesive is preferable because good light resistance, weather resistance, and heat resistance are easily provided. That is, the pressure-sensitive adhesive layer is preferably an acrylic pressure-sensitive adhesive layer.

Examples of the monomer constituting the acrylic pressure-sensitive adhesive include acrylic acid alkyl esters such as ethyl acrylate, butyl acrylate, amyl acrylate, 2-ethylhexyl acrylate, octyl acrylate, cyclohexyl acrylate, and benzyl acrylate; and methacrylic acid alkyl esters such as ethyl methacrylate, butyl methacrylate, 2-ethylhexyl methacrylate, cyclohexyl methacrylate, and benzyl methacrylate. The monomer constituting the acrylic pressure-sensitive adhesive may include, in addition to any monomer described above, a vinyl group-containing compound such as vinyl acetate, vinyl propionate, vinyl ether, styrene, acrylonitrile, or methacrylonitrile, as a copolymerizing monomer.

The pressure-sensitive adhesive layer may contain additive(s) such as a refractive index modifier, an ultraviolet absorber, an antioxidant, a filler, a flame-retardant, an antimicrobial agent, a light stabilizer, a colorant, a visible light absorber, an infrared absorber, and/or an antistatic agent. Any other layer than the pressure-sensitive adhesive layer may also contain such additive(s).

The thickness of the pressure-sensitive adhesive layer is preferably 50 μm or more, more preferably 100 μm or more, further preferably 125 μm or more, still further preferably 150 μm or more, and further preferably 200 μm or more.

If the thickness of the pressure-sensitive adhesive layer is too large, the surface hardness of the resin panel is easily deteriorated. Therefore, the thickness of the pressure-sensitive adhesive layer is preferably 400 μm or less, more preferably 300 μm or less, and further preferably 250 μm or less.

An embodiment of a suitable range of the thickness of the pressure-sensitive adhesive layer is, for example, a range from 50 μm to 400 μm, a range from 50 μm to 300 μm, a range from 50 μm to 250 μm, a range from 100 μm to 400 μm, a range from 100 μm to 300 μm, a range from 100 μm to 250 μm, a range from 125 μm to 400 μm, a range from 125 μm to 300 μm, a range from 125 μm to 250 μm, in a range from 150 μm to 400 μm, a range from 150 μm to 300 μm, a range from 150 μm to 250 μm, a range from 200 μm to 400 μm, a range from 200 μm to 300 μm, or a range from 200 μm to 250 m.

In the case where the expression (2) is satisfied, the thickness of the pressure-sensitive adhesive layer may be less than 50 m. However, even if the expression (2) is satisfied, a too small thickness of the pressure-sensitive adhesive layer causes deterioration in handleability of the resin panel.

Thus, in the case where the expression (2) is satisfied, the lower limit of the thickness of the pressure-sensitive adhesive layer is preferably 5 μm or more, more preferably 10 μm or more, more preferably 30 μm or more, and more preferably 50 μm or more.

In the case where the expression (2) is satisfied, the upper limit of the thickness of the pressure-sensitive adhesive layer is preferably 400 μm or less, more preferably 300 μm or less, and further preferably 250 μm or less, as described above. In the case where the expression (2) is satisfied, the upper limit of the thickness of the pressure-sensitive adhesive layer may be 200 μm or less, or may be 100 μm or less.

In the case where the expression (2) is satisfied, an embodiment of a suitable range of the thickness of the pressure-sensitive adhesive layer is, for example, a range from 5 μm to 400 μm, a range from 5 μm to 300 μm, a range from 5 μm to 250 μm, a range from 5 μm to 200 μm, a range from 5 μm to 100 μm, in a range from 10 μm to 400 μm, a range from 10 μm to 300 μm, a range from 10 μm to 250 μm, a range from 10 μm to 200 μm, a range from 10 μm to 100 μm, a range from 30 μm to 400 μm, a range from 30 μm to 300 μm, a range from 30 μm to 250 μm, a range from 30 μm to 200 μm, a range from 30 μm to 100 μm, a range from 50 μm to 400 μm, a range from 50 μm to 300 μm, a range from 50 μm to 250 m, a range from 50 μm to 200 μm, or in a range from 50 μm to 100 m.

In the case where the conductive layer is a conductive layer formed into a pattern, the thickness t1 of the conductive layer and the thickness t2 of the pressure-sensitive adhesive layer preferably satisfy $t1<t2$ for the purpose of adhesiveness between the resin layer and the plastic film. When $t1<t2$ is satisfied, irregularities corresponding to the pattern of the conductive layer can be easily inhibited from occurring on the surface of the resin panel.

If t2 is too large relative to t1, the surface hardness of the resin panel is easily deteriorated and/or the variation in thickness of the pressure-sensitive adhesive layer is easily caused. Therefore, t2/t1 is preferably more than 1.0 and 8.0 or less, and more preferably 2.0 or more and 6.0 or less. t2/t1 may be more than 1.0 and 7.0 or less, or may be 2.0 or more and 8.0 or less.

Even if $t1 \geq t2$ is satisfied, the area ratio of the conductive layer can be adjusted to ensure given adhesiveness by flowage in the pressure-sensitive adhesive layer.

The storage elastic modulus at 23 °C of the pressure-sensitive adhesive layer is preferably 0.01 MPa or more and 1.0 MPa or less, and more preferably 0.05 MPa or more and 0.5 MPa or less. The storage elastic modulus may be 0.01 MPa or more and 0.5 MPa or less, or may be 0.05 MPa or more and 1.0 MPa or less. When the storage elastic modulus of the pressure-sensitive adhesive layer falls within the above-described range, it is possible to facilitate suppression of deterioration in interlayer adhesiveness, suppression of deterioration in surface hardness of the resin panel, and suppression of amplification of the variation in thickness of the pressure-sensitive adhesive layer due to stress.

Herein, the storage elastic modulus of the pressure-sensitive adhesive layer is a value measured by a measurement method according to JIS K7244-1:1998. Specifically, the value is a value obtained by viscoelasticity measurement in a shear mode at −50 °C to 150 °C, a rate of temperature rise of 3.0 °C/min, and a frequency of 1.0 Hz.

<Conductive Layer>

The conductive layer acts to allow the resin panel to generate heat by energization.

Examples of the conductive layer include a conductive layer formed into a pattern in a surface of the resin panel (FIG. 1), a conductive layer formed in a solid tone in a partial surface of the resin panel (not shown), and conductive layers each formed in the whole surface of the resin panel (FIGS. 2 and 3). The "conductive layer formed in a solid tone in a partial surface of the resin panel", in other words, means a conductive layer which evenly covers a partial surface of the resin panel and which has no pattern.

The conductive layer is preferably a conductive layer formed in the whole surface of the resin panel in order to more inhibit irregularities from occurring on the surface of the plastic film. The conductive layer formed in the whole surface of the resin panel is preferable in that almost no moire is caused and also distortion of infrared light hardly occurs.

<<Conductive Layer Formed into Pattern>>

In the case of the conductive layer formed into a pattern in a surface of the resin panel, the resin panel preferably has the above-described first lamination configuration.

Examples of the conductive layer formed into a pattern include one in which a conductive metal containing one or more metals selected from the group consisting of copper, aluminum, iron and silver is formed into a pattern, and one in which a conductive composition comprising the conductive metal is formed into a pattern. Among them, one in which the conductive metal is formed into a pattern is preferable.

Examples of the conductive composition comprising the conductive metal include a conductive metal paste.

In the case of the conductive layer formed into a pattern, the area ratio of the conductive layer is preferably 5% or more, and more preferably 10% or more, in order to increase heat generation efficiency. The area ratio of the conductive layer is preferably 20% or less, and more preferably 15% or less, in order to provide good adhesiveness between the resin layer and the plastic film, provide good accuracy of an infrared sensor, and/or allow the conductive layer to be hardly viewed.

The area ratio of the conductive layer can be calculated by the following expression.

Area ratio of conductive layer=[Area of place where conductive layer is formed/Area of resin panel]×100

The lower limit of the thickness of the conductive layer formed into a pattern is preferably 2 μm or more, more preferably 6 μm or more, more preferably 10 μm or more, more preferably 15 μm or more, and more preferably 17 μm or more, in order to increase heat generation efficiency, and the upper limit thereof is preferably 30 μm or less, more preferably 25 μm or less, and further preferably 23 μm or less, in order to more inhibit irregularities from occurring on the surface of the plastic film.

An embodiment of a suitable range of the thickness of the conductive layer formed into a pattern is, for example, in a range from 2 μm to 30 μm, in a range from 2 μm to 25 m, in a range from 2 μm to 23 μm, in a range from 6 μm to 30 μm, in a range from 6 μm to 25 μm, in a range from 6 μm to 23 μm, in a range from 10 μm to 30 μm, in a range from 10 m to 25 μm, in a range from 10 μm to 23 μm, in a range from 15 μm to 30 μm, in a range from 15 μm to 25 μm, in a range from 15 μm to 23 μm, in a range from 17 μm to 30 μm, in a range from 17 μm to 25 μm, or in a range from 17 μm to 23 m.

The lower limit of the width of the conductive layer formed into a pattern is preferably m or more, more preferably 20 μm or more, and further preferably 25 μm or more, in order to increase heat generation efficiency, and the upper limit thereof is preferably 50 μm or less, more preferably 40 μm or less, and further preferably 35 μm or less, in order to make the pattern invisible.

An embodiment of a suitable range of the width of the conductive layer formed into a pattern is, for example, 10 μm or more and 50 μm or less, 10 μm or more and 40 μm or less, 10 μm or more and 35 μm or less, 20 μm or more and 50 μm or less, 20 μm or more and 40 μm or less, 20 μm or more and 35 μm or less, 25 μm or more and 50 μm or less, 25 μm or more and 40 μm or less, or 25 μm or more and 35 μm or less.

The pattern of the conductive layer may be a regular or random pattern. Examples of a regular pattern include net-like patterns such as triangular grid, quadrangular grid and honeycomb grid patterns.

A member having a given pattern may be present inside an infrared sensor. The pattern of the conductive layer is preferably a random pattern in order to suppress moire with such a member having a given pattern.

<<Conductive Layer Formed in Solid Tone and Conductive Layer Formed in Whole Surface>>

In the case of the conductive layer formed in a solid tone in a partial surface of the resin panel or the conductive layer formed in a whole surface of the resin panel, the resin panel preferably has the above-described second lamination configuration.

In the case of the conductive layer formed in a solid tone in the partial surface, the area ratio of the conductive layer is preferably 2% or more, and more preferably 5% or more, in order to increase heat generation efficiency. The area ratio of the conductive layer is preferably 15% or less, and more preferably 10% or less, in order to provide good accuracy of an infrared sensor.

The area ratio of the conductive layer can be calculated by the following expression.

$$\text{Area ratio of conductive layer} = [\text{Area of place where conductive layer is formed/Area of resin panel}] \times 100$$

An embodiment of a suitable range of the area ratio of the conductive layer formed in a solid tone in the partial surface is, for example, 2% or more and 15% or less, 2% or more and 10% or less, 5% or more and 15% or less, or 5% or more and 10% or less.

Examples of the conductive layer formed in a solid tone and the conductive layer formed in the whole surface include a thin film obtained by physical vapor deposition or chemical vapor deposition of a metal or metal oxide having conductivity; a coating film formed from a polymer having conductivity; and a conductive metal fiber-containing layer. Among them, a conductive metal fiber-containing layer is preferable because of easily increasing heat generation efficiency and allowing infrared light to pass through the layer.

The conductive metal fiber has conductivity and has a shape having a fully long length as compared with the thickness (for example, diameter), and, for example, one having a length about five times or more the thickness is encompassed in the conductive metal fiber. The conductive metal fiber can efficiently form a conductive path even in a small amount thereof by contacting such conductive metal fibers in a planar direction (two-dimensional direction) of the layer and thus forming a network structure.

The fiber diameter of the conductive metal fiber is preferably 200 nm or less, more preferably 50 nm or less, and more preferably 25 nm or less. When the fiber diameter of the conductive metal fiber is 200 nm or less, it is possible to easily suppress an increase in haze and diffusion of laser light. The lower limit of the fiber diameter of the conductive metal fiber is 5 nm or more, and more preferably 10 nm or more, in order to suppress disconnecting and provide good conductivity.

An embodiment of a preferable range of the fiber diameter of the conductive metal fiber is, for example, a range of 5 nm to 200 nm, a range of 5 nm to 50 nm, a range of 5 nm to 25 nm, a range of 10 nm to 200 nm, a range of 10 nm to 50 nm, or a range of 10 nm to 25 nm.

The fiber length of the conductive metal fiber is preferably 1 μm or more, and more preferably 5 μm or more. When the fiber length of the conductive metal fiber is 1 μm or more, good conductivity can be provided. A preferable upper limit of the fiber length of the conductive metal fiber is 500 μm or less, more preferably 100 μm or less, and more preferably 20 μm or less, in order to not only provide good light transmittivity, but also inhibit laser light from being diffused.

An embodiment of a preferable range of the fiber length of the conductive metal fiber is, for example, a range of 1 μm to 500 μm, a range of 1 μm to 100 μm, a range of 1 μm to 20 μm, a range of 5 μm to 500 μm, a range of 5 μm to 100 μm, or a range of 5 μm to 20 m.

The fiber diameter of the conductive metal fiber is obtained by measuring the fiber diameters of 50 of such conductive metal fibers at 1000× to 500000× with a transmission electron microscope to determine the average value of the fiber diameters of 50 of such conductive metal fibers. The fiber length of the conductive metal fiber is obtained by measuring the fiber lengths of 50 of such conductive metal fibers at 1000× to 500000× with a scanning electron microscope to determine the average value of the fiber lengths of 50 of such conductive metal fibers.

The conductive metal fiber is preferably at least one selected from the group consisting of a metal fiber and a synthetic fiber covered with a metal.

The metal fiber here used can be, for example, a fiber made of a metal such as iron, gold, silver, aluminum, nickel or titanium, or an alloy thereof. Examples of the synthetic fiber covered with a metal include a fiber obtained by coating a synthetic fiber such as an acrylic fiber with, for example, a metal such as gold, silver, aluminum, nickel or titanium, or an alloy thereof. Among them, a silver fiber is preferable because of having a good transmittance at a wavelength in the infrared region and thus easily providing good accuracy of an optical sensor.

The conductive metal fiber can be used singly or in combinations of two or more kinds thereof. In particular, the conductive metal fiber is preferably a metal fiber, and more preferably a silver fiber, in order to allow both a low haze value and low resistance to be achieved. When the conductive metal fiber is a silver fiber, transparency and a low resistivity can be achieved at higher levels. A silver fiber has a good transmittance at a wavelength in the infrared region and therefore is preferable in that good accuracy of an optical sensor is easily provided.

The conductive metal fiber-containing layer preferably contains a cover resin.

The cover resin serves to cover the conductive metal fiber to such an extent that electric conduction is obtained from the surface of the conductive metal fiber-containing layer and the resistance value is not too high, and thus prevent the conductive metal fiber from being left from the conductive metal fiber-containing layer.

The thickness of the cover resin is preferably in a range from 10 nm to 300 nm, and more preferably in a range from 50 nm to 200 nm. The thickness of the cover resin may be in a range from 10 nm to 200 nm, or may be in a range from 50 nm to 300 nm.

Examples of the cover resin include one containing a polymer of a polymerizable compound. The cover resin may contain, in addition to the polymer of a polymerizable compound, a solvent drying type resin. Examples of the polymerizable compound include an ionizing radiation-polymerizable compound and/or a thermally polymerizable compound.

The ionizing radiation-polymerizable compound has at least one ionizing radiation-polymerizable functional group in one molecule. Herein, the "ionizing radiation-polymerizable functional group" is a functional group polymerizable by irradiation with ionizing radiation. Examples of the ionizing radiation-polymerizable functional group include ethylenically unsaturated groups such as a (meth)acryloyl group, a vinyl group, and an allyl group. Here, the "(meth) acryloyl group" means that both "acryloyl group" and "methacryloyl group" are encompassed. Examples of the ionizing radiation for irradiation during polymerization of the ionizing radiation-polymerizable compound include visible light, ultraviolet light, X-ray, electron beam, α-ray, β-ray, and γ-ray.

Examples of the ionizing radiation-polymerizable compound include an ionizing radiation-polymerizable monomer, an ionizing radiation-polymerizable oligomer, or an ionizing radiation-polymerizable prepolymer, and these can be used with appropriate adjustment. The ionizing radiation-polymerizable compound is preferably a combination of an ionizing radiation-polymerizable monomer and an ionizing radiation-polymerizable oligomer or an ionizing radiation-polymerizable prepolymer.

The thermally polymerizable compound has at least one thermally polymerizable functional group in one molecule. Herein, the "thermally polymerizable functional group" is a functional group polymerizable with the same functional group or any other functional group by heating. Examples of the thermally polymerizable functional group include a hydroxyl group, a carboxyl group, an isocyanate group, an amino group, a cyclic ether group, and a mercapto group.

The thermally polymerizable compound is not particularly limited, and examples thereof include an epoxy compound, a polyol compound, an isocyanate compound, a melamine compound, a urea compound, and a phenol compound.

The solvent drying type resin is a resin to be formed into a film by only drying a solvent added for adjustment of the solid content during application, and examples thereof include a thermoplastic resin. In the case where the solvent drying type resin is added, film defects on a surface onto which an application liquid is applied can be effectively prevented during formation of the cover resin.

The conductive metal fiber-containing layer may contain a reaction inhibitor.

The reaction inhibitor is for suppressing deterioration in conductivity due to reaction of the conductive metal fiber and another substance after application of a composition for the cover resin. Examples of such another substance include sulfur, oxygen, and halogen present under a reaction atmosphere. In the case where the conductive layer and the pressure-sensitive adhesive layer are in contact with each other, a material constituting the pressure-sensitive adhesive layer can also serve as such another substance.

Examples of the reaction inhibitor include nitrogen-containing compounds such as a benzoazole-based compound, a triazole-based compound, a tetrazole-based compound, an isocyanuric acid-based compound, and an aniline-based compound. Among them, a tetrazole-based compound is preferable.

Examples of the nitrogen-containing compound used as the reaction inhibitor include 1-aminobenzoazole, 5-methylbenzotriazole, 1,2,3-benzotriazole, 1-methyl-1H-tetrazole-5-amine, DL-α-tocopherol, 1-octadecanethiol, 2-mercapto-5-(trifluoromethyl)pyridine, diallyl isocyanurate, diallylpropyl isocyanurate, 6-anilino-1,3,5-triazine-2,4-dithiol, thiocyanuric acid, 3,5-dimethyl-1H-1,2,4-triazole, 4-(1,2,4-triazol-1-ylmethyl)aniline, 6-(dibutylamino)-1,3,5-triazine-2,4-dithiol, 4-(1,2,4-triazol-1-yl)aniline, 2-methylthio-benzothiazole, 1-phenyl-5-mercapto-1H-tetrazole, 5-mercapto-1-methyltetrazole, 5-(methylthio)-1H-tetrazole, 5-amino-1H-tetrazole, 1-(2-dimethylaminoethyl)-5-mercaptotetrazole, 1-(2-dimethylaminoethyl)-5-mercaptotetrazole, 1-(4-hydroxyphenyl)-5-mercapto-1H-tetrazole, 3-amino-5-mercapto-1,2,4-triazole, and 3,5-diamino-1,2,4-triazole.

The content of the reaction inhibitor in the conductive metal fiber-containing layer is preferably 0.01% by mass or more and 10% by mass or less, more preferably 0.05% by mass or more and 5.0% by mass or less, and further preferably 0.10% by mass or more and 3.0% by mass or less. When the content of the reaction inhibitor is 0.01% by mass or more, the conductive metal fiber can be inhibited from reacting with another substance. When the content of the reaction inhibitor is 10% by mass or less, reaction of the conductive metal fiber and the reaction inhibitor can progress not only in the surface of the conductive metal fiber, but also inside the fiber, to inhibit conductivity from being deteriorated.

The thickness of the conductive metal fiber-containing layer is preferably in a range from 10 nm to 300 nm, more preferably in a range from 25 nm to 150 nm, and more preferably in a range from 50 nm to 80 nm. Another preferable range of the thickness of the conductive metal fiber-containing layer is, for example, a range from 10 nm to 150 nm, a range from 10 nm to 80 nm, a range from 25 nm to 300 nm, a range from 25 nm to 80 nm, a range from 50 nm to 300 nm, or a range from 50 nm to 150 nm.

The difference in thickness of the conductive metal fiber-containing layer is preferably 50 nm or less in order to more inhibit irregularities from occurring on the surface of the plastic film. The difference in thickness is more preferably 30 nm or less, and further preferably 15 nm or less.

The difference in thickness of the conductive metal fiber-containing layer can be calculated by the following procedures (1) to (3).

(1) A cross section photograph of the resin panel is taken by STEM, and any region corresponding a length of 1 μm is selected from the cross section photograph. Examples of STEM include trade name "SU9000" from Hitachi High-Tech Corporation.

(2) The difference between the minimum value and the maximum value of the thickness of the conductive metal fiber-containing layer is determined in the region selected. The found value is defined as the difference in thickness in the region.

(3) The workings (1) and (2) are performed in 10 cross section photographs. The average of the differences in thickness in 10 regions is defined as the difference in thickness of the conductive metal fiber-containing layer.

[Resin Panel of Second Embodiment]

A resin panel for an infrared sensor of a second embodiment of the present disclosure is a resin panel for an infrared sensor, the resin panel comprising a resin layer and a plastic film, as well as comprising a conductive layer between the resin layer and the plastic film, and satisfying the following expression (3):

$$30 \leq T \times Y^3 \quad (3)$$

wherein "T" represents the thickness (unit: "μm") of the plastic film, and "Y" represents the Young's modulus (unit: "GPa") of the plastic film.

FIGS. 7 and 8 are each a cross-sectional view showing one embodiment of the resin panel of the second embodiment of the present disclosure.

A resin panel 10 in each of FIGS. 7 and 8 comprises a resin layer 1 and a plastic film 4, as well as comprises a conductive layer 2 between the resin layer 1 and the plastic film 4.

The conductive layer 2 in FIG. 7 is formed into a pattern. The conductive layer 2 in FIG. 8 is formed on the whole surface of the resin panel. The resin panel 10 in FIG. 8 comprises an antireflection layer 5 on a surface of the plastic film 4, the surface being on the side other than the side provided with the resin layer.

<Lamination Configuration>

A lamination configuration of the resin panel of the second embodiment is not limited to the lamination configurations in FIGS. 7 and 8. For example, the resin panel of the second embodiment may further comprise an additional plastic film (not shown). The resin panel of the second embodiment may comprise a heat seal layer (not shown) between the resin layer and the conductive layer.

<Expression (3)>

The resin panel of the second embodiment of the present disclosure is required to satisfy the following expression (3):

$$30 \leq T \times Y^3 \quad (3)$$

wherein "T" represents the thickness (unit: "μm") of the plastic film, and "Y" represents the Young's modulus (unit: "GPa") of the plastic film.

The resin panel of the second embodiment can be produced by a process including B1 to B2 described below. Preliminary molding for molding a film for insert molding into a given shape such as a curved surface shape may also be performed between steps B1 and B2.

B1. A step of providing a film for insert molding, comprising a conductive layer on a plastic film.

B2. A step of inserting the film for insert molding into an injection molding mold, and subsequently injecting a composition for forming a resin layer to obtain a laminated body in which a surface of the conductive layer of the film for insert molding and the resin layer are closely attached to each other.

In the above-described injection molding, for example, insert molding, the resin injected collides with a film, for example, the film for insert molding. A large pressure is here applied to the film for insert molding. The pressure differs depending on the location of the film for insert molding. Therefore, irregularities caused by the variation in pressure may occur on the surface of the plastic film. If irregularities occur on the surface of the plastic film, the variation in infrared transmissivity in a surface of the resin panel occurs to result in deterioration in accuracy of an infrared sensor.

The present inventors have found that a plastic film satisfying the expression (3) can be used to inhibit the variation in pressure from being propagated to the surface of the plastic film and inhibit irregularities from occurring on the surface of the plastic film. Therefore, when the expression (3) is satisfied, deterioration in accuracy of an infrared sensor can be suppressed.

The reason why the Young's modulus Y is raised to the third power in the expression (3) is because, while the Young's modulus is a one-dimensional parameter with a sample pulled in one direction, irregularities occurring on the surface of the plastic film have a three-dimensional shape.

The reason why the thickness of the plastic film is multiplied with the cube of the Young's modulus in the expression (3) is because the respective lengths in the X-axis direction and the Y-axis direction of the plastic film are fully long as compared with the length in the Z-axis direction being the thickness direction of the plastic film. In more explanation, while the respective lengths in the X-axis direction and the Y-axis direction of the plastic film are fully long and thus the deformations in the X-axis direction and the Y-axis direction of the plastic film are easily relaxed, the length in the Z-axis direction of the plastic film is short and thus the deformation in the thickness direction of the plastic film is hardly relaxed. Therefore, the length in the Z-axis direction in which the deformation is hardly relaxed is multiplied with the cube of the Young's modulus.

<Resin Layer>

The resin layer preferably contains a resin as a main component.

The main component means a component that accounts for 50% by mass or more, preferably 70% by mass or more, and more preferably 90% by mass or more of the total solid content of the resin layer.

The resin of the resin layer is preferably a thermoplastic resin in view of ease in injection molding such as insert molding.

Examples of the thermoplastic resin include a single resin selected from the group consisting of a polystyrene-based resin, a polyolefin-based resin, an ABS resin, an AS resin, an AN resin, a polyphenyleneoxide-based resin, a polycarbonate-based resin, a polyacetal-based resin, an acrylic resin, a polyethylene terephthalate-based resin, a polybutylene terephthalate-based resin, a polysulfone-based resin, and a polyphenylenesulfide-based resin, and mixtures thereof. Among them, a polycarbonate-based resin and an acrylic resin are preferable, and a polycarbonate-based resin, which is excellent in impact resistance, is more preferable.

The above biomass-derived resin may be contained as the resin of the resin layer.

The resin layer may contain a colorant.

An embodiment of the colorant in the resin layer in the second embodiment can be the same as the embodiment of the colorant in the resin layer in the first embodiment.

An embodiment of the thickness of the resin layer in the second embodiment can be the same as the embodiment of the thickness of the resin layer in the first embodiment.

The resin layer in the second embodiment preferably has a curved surface in order to provide good design.

In the case where the resin layer has a curved surface, surface irregularities caused by the variation in pressure are easily amplified. However, even if the resin panel of the present disclosure has the resin layer, which has a curved surface, the variation can be inhibited from being propagated on the surface and therefore irregularities can be easily inhibited from occurring on the surface of the plastic film.

An embodiment of the range of the radius of curvature of the resin layer in the second embodiment can be the same as the embodiment of the range of the radius of curvature in the first embodiment.

<Plastic Film>

Examples of the resin constituting the plastic film include one or more selected from the group consisting of resins, for example, polyolefin-based resins such as polyethylene and polypropylene; vinyl-based resins such as polyvinyl chloride, polyvinylidene chloride, polyvinyl alcohol, an ethylene-vinyl acetate copolymer, and an ethylene-vinyl alcohol copolymer; polyester-based resins such as polyethylene terephthalate, polyethylene naphthalate, and polybutylene terephthalate; acrylic resins such as polymethyl (meth)acrylate and polyethyl (meth)acrylate; styrene-based resins such as polystyrene; and polyamide-based resins such as nylon 6 and nylon 66. The resin constituting the plastic film may be a biomass-derived resin. The plastic film may be any of an un-stretched film, a uniaxially stretched film, and a biaxially stretched film.

Among these plastic films, a biaxially stretched firm is preferable in view of heat resistance and dimension stability, and an acrylic film, a polycarbonate film, or a co-extruded film of an acrylic resin and polycarbonate is preferable in view of moldability for insert molding and the like and weather resistance.

In order to inhibit irregularities from occurring on the surface of the plastic film, $T \times Y^3$ in the expression (3) in the plastic film is more preferably 33 or more, more preferably 40 or more, more preferably 50 or more, and more preferably 60 or more.

If $T \times Y^3$ is a too large value, cracking easily occurs in bending of the plastic film.

Therefore, $T \times Y^3$ is preferably 50000 or less, more preferably 41000 or less, and more preferably 25000 or less.

An embodiment of a suitable range of $T \times Y^3$ is, for example, in a range from 30 to 50000, in a range from 30 to 41000, in a range from 30 to 25000, in a range from 33 to 50000, in a range from 33 to 41000, in a range from 33 to 25000, in a range from 40 to 50000, in a range from 40 to 41000, in a range from 40 to 25000, in a range from 50 to 50000, in a range from 50 to 41000, in a range from 50 to 25000, in a range from 60 to 50000, in a range from 60 to 41000, or in a range from 60 to 25000.

The Young's modulus of the plastic film is preferably 1.3 GPa or more, more preferably 1.5 GPa or more, and more preferably 2.0 GPa or more, in order that the expression (3) is easily satisfied.

If the Young's modulus of the plastic film is too large, cracking easily occurs in bending of the plastic film. Therefore, the Young's modulus of the plastic film is preferably 9.0 GPa or less, more preferably 8.0 GPa or less, and more preferably 7.0 GPa or less.

An embodiment of a suitable range of the Young's modulus of the plastic film is, for example, a range of 1.3 GPa to 9.0 GPa, a range of 1.3 GPa to 8.0 GPa, a range of 1.3 GPa to 7.0 GPa, a range of 1.5 GPa to 9.0 GPa, a range of 1.5 GPa to 8.0 GPa, a range of 1.5 GPa to 7.0 GPa, a range of 2.0 GPa to 9.0 GPa, a range of 2.0 GPa to 8.0 GPa, or a range of 2.0 GPa to 7.0 GPa.

An embodiment of the thickness of the plastic film in the second embodiment can be the same as the embodiment of the thickness of the plastic film in the first embodiment.

<Conductive Layer>

The conductive layer acts to allow the resin panel to generate heat by energization.

Examples of the conductive layer include a conductive layer formed into a pattern in a surface of the resin panel (FIG. 7), a conductive layer formed in a solid tone in a partial surface of the resin panel (not shown), and a conductive layer formed in the whole surface of the resin panel (FIG. 8).

The conductive layer is preferably a conductive layer formed in the whole surface of the resin panel in order to inhibit irregularities from occurring on the surface of the plastic film. The conductive layer formed in the whole surface of the resin panel is preferable in that almost no moire is caused and also distortion of infrared light hardly occurs.

<<Conductive Layer Formed into Pattern>>

Embodiments of the material, the thickness, the area ratio, and the like of the conductive layer formed into a pattern in the second embodiment can be the same as the embodiments of those of the conductive layer formed into a pattern in the first embodiment.

<<Conductive Layer Formed in Solid Tone and Conductive Layer Formed in Whole Surface>>

Embodiments of the material, the thickness, the area ratio, and the like of the conductive layer formed in a solid tone in the second embodiment can be the same as the embodiments of those of the conductive layer formed in a solid tone in the first embodiment.

Embodiments of the material, the thickness, and the like of the conductive layer formed in the whole surface in the second embodiment can be the same as the embodiments of those of the conductive layer formed in the whole surface in the first embodiment.

<Heat Seal Layer>

The resin panel of the second embodiment may comprise a heat seal layer between the resin layer and the conductive layer in order to provide good adhesiveness.

The heat seal layer preferably contains a resin as a main component.

The main component means a component that accounts for 50% by mass or more, preferably 70% by mass or more, and more preferably 90% by mass or more of the total solid content of the heat seal layer.

The resin used in the heat seal layer is preferably a thermoplastic resin. The thermoplastic resin used in the heat seal layer is preferably a resin high in affinity with the thermoplastic resin of the resin layer.

The thickness of the heat seal layer is preferably in a range of 0.1 μm to 50 μm, and more preferably in a range of 0.5 μm to 30 m.

<Antireflection Layer>

The resin panels of the first embodiment and the second embodiment of the present disclosure may each comprise an antireflection layer on at least one of a surface of the resin layer, the surface being on the other side than the side provided with the plastic film, and a surface of the plastic film, the surface being on the other side than the side provided with the resin layer. When the antireflection layer is comprised, a high light transmittance at a wavelength of 905 nm or the like is easily provided. The resin panel more preferably comprises an antireflection layer on both of a surface of the resin layer, the surface being on the other side than the side provided with the plastic film, and a surface of the plastic film, the surface being on the other side than the side provided with the resin layer.

Common antireflection layers are designed such that the reflectance at or around 550 nm, which is the center wavelength of the visible region, is lowest. The antireflection layer in the present disclosure is preferably designed such that the reflectance at or around a wavelength of 905 nm is lowest. The light-emitting center wavelength of an optical sensor, here adopted, may also be 1320 nm or 1550 nm. Therefore, the antireflection layer in the present disclosure may be designed such that the reflectance at or around a wavelength of 1320 nm, or at or around a wavelength of 1550 nm is lowest.

The antireflection layer may have, for example, a single layer structure of a low refractive index layer, or a two-layered structure of a high refractive index layer and a low refractive index layer, or the antireflection layer may be formed from three or more layers. In the case of a two-layered structure of a high refractive index layer and a low refractive index layer, the high refractive index layer is disposed so as to be located more inside the resin panel than the low refractive index layer. The antireflection layer is preferably a single layer structure of a low refractive index layer in order to suppress diffusion of laser light.

The total thickness of the antireflection layer may be adjusted with respect to each configuration (single layer, two layers, three or more layers) of the antireflection layer so that the reflectance at or around a wavelength of 905 nm is low. The total thickness of the antireflection layer is preferably in a range of 120 nm to 550 nm, and more preferably in a range of 170 nm to 450 nm.

—Low Refractive Index Layer—

The range of the refractive index of the low refractive index layer is preferably 1.26 to 1.42, more preferably 1.28 to 1.40, more preferably 1.30 to 1.38, more preferably 1.32 to 1.37, and more preferably 1.33 to 1.36.

The range of the thickness of the low refractive index layer is preferably 115 nm to 260 nm, more preferably 120 nm to 250 nm, more preferably 120 nm to 200 nm, more preferably 150 nm to 200 nm, more preferably 160 nm to 190 nm, and more preferably 165 nm to 185 nm.

When the refractive index and the thickness of the low refractive index layer fall within the above-described ranges, the reflectance at or around a wavelength of 905 nm can be easily set so as to be lowest. In the case where the reflectance at or around a wavelength of 1320 nm is decreased, it is preferable that the refractive index of the low refractive index layer fall within the above-described range and the thickness is at or around 330 nm. In the case where the reflectance at or around a wavelength of 1550 nm is decreased, it is preferable that the refractive index of the low refractive index layer fall within the above-described range and the thickness is at or around 387 nm.

Methods for forming the low refractive index layer can be roughly classified into a wet process and a dry process. Examples of the wet process include a formation method involving a sol-gel process with a metal alkoxide or the like, a formation method involving applying a resin having a low refractive index, such as a fluororesin, and a formation method involving applying an application liquid for forming a low refractive index layer, which is a resin composition containing low refractive index particles. Examples of the dry process include a formation method involving a physical vapor-phase growth process or a chemical vapor-phase growth process with selecting particles having a desired refractive index among low refractive index particles described later.

Such a wet process is excellent in production efficiency. A low refractive index layer formed by such a wet process is preferable in that cracking caused by the change in temperature and cracking caused by curved surface processing are easily suppressed. In such a wet process, formation by an application liquid for forming a low refractive index layer, which is a binder resin composition containing low refractive index particles, is preferable.

Any of particles made of an inorganic compound such as silica and magnesium fluoride and particles made of an organic compound can be used as the low refractive index particles without limitation, but particles with structure having voids are preferably used in view of improvements in antireflection properties by a reduction in refractive index.

Particles with structure having voids have fine voids inside thereof, and the voids are filled with gas such as air having a refractive index of 1.0, for example, and therefore the refractive index thereof is low. Examples of such particles having voids include inorganic or organic porous particles and hollow particles, and include, for example, porous silica, hollow silica particles, porous polymer particles, and hollow polymer particles.

If the low refractive index particles are too small, the refractive index of the low refractive index layer is hardly decreased. If the low refractive index particles are too large, laser light is hardly inhibited from being diffused. Therefore, the range of the average particle diameter of the low refractive index particles is preferably 4 nm to 210 nm, more preferably 5 nm to 200 nm, more preferably 5 nm to 100 nm, more preferably 10 nm to 80, and more preferably 20 nm to 70.

If the content of the low refractive index particles is too low, the refractive index of the low refractive index layer is hardly decreased. If the content of the low refractive index particles is too high, laser light is hardly inhibited from being diffused. Therefore, the range of the content of the low refractive index particles is preferably 40 parts by mass to 220 parts by mass, more preferably 50 parts by mass to 200 parts by mass, more preferably 70 parts by mass to 150 parts by mass, and more preferably 80 parts by mass to 140 parts by mass based on 100 parts by mass of a binder component.

The binder resin composition is preferably a curable resin composition. The curable resin composition is formed into a cured product and then a binder component in the antireflection layer.

Examples of the curable resin composition include a thermosetting resin composition and an ionizing radiation curable resin composition, and, in particular, an ionizing radiation curable resin composition is preferable.

The thermosetting resin composition is a resin composition comprising at least a thermosetting resin, and is a resin composition to be thermally cured. Examples of the thermosetting resin include an acrylic resin, a urethane resin, a phenol resin, a urea-melamine resin, an epoxy resin, an unsaturated polyester resin, and a silicone resin. A curing agent such as an isocyanate-based curing agent is, if necessary, added to such a curable resin in the thermosetting resin composition.

The ionizing radiation curable resin composition is a composition comprising a compound having an ionizing radiation-curable functional group. Examples of the compound having an ionizing radiation-curable functional group include the same as those exemplified for the ionizing radiation-polymerizable compound of the conductive layer.

The ionizing radiation-polymerizable compound of the low refractive index layer is preferably smaller in number of ionizing radiation-curable functional groups per unit mass than the ionizing radiation-polymerizable compound of the conductive layer in order to provide good cracking resistance. The low refractive index layer is disposed closer to the surface than the conductive layer in the resin panel, and therefore the above-described configuration can easily provide good cracking resistance of the low refractive index layer.

—High Refractive Index Layer—

The antireflection layer may further have a high refractive index layer. When the antireflection layer has not only the low refractive index layer, but also the high refractive index layer, the wavelength region in which the reflectance is low is widened and the applicable range of the wavelength of infrared laser can be widened. Furthermore, when the antireflection layer has the high refractive index layer, the reflectance peak at a given wavelength can be sharpened. The given wavelength is, for example, 905 nm, 1320 nm, or 1550 nm.

The range of the refractive index of the high refractive index layer is preferably 1.55 to 1.85, and more preferably 1.56 to 1.70.

The range of the thickness of the high refractive index layer is preferably 300 nm or less, more preferably 20 nm to 250 nm, and further preferably 100 nm to 200 nm.

The high refractive index layer can be formed from an application liquid for a high refractive index layer, the liquid containing a binder resin composition and high refractive index particles, for example. The binder resin composition here used can be, for example, the curable resin composition exemplified for the conductive layer.

In the case where the ionizing radiation-polymerizable compound is used as the curable resin composition, the ionizing radiation-polymerizable compound of the high refractive index layer is preferably smaller in number of ionizing radiation-curable functional groups per unit mass than the ionizing radiation-polymerizable compound of the conductive layer in order to provide good cracking resistance. The high refractive index layer is disposed closer to the surface than the conductive layer in the resin panel, and therefore the above-described configuration can easily provide good cracking resistance of the high refractive index layer.

Examples of the high refractive index particles include antimony pentoxide, zinc oxide, titanium oxide, cerium oxide, tin-doped indium oxide, antimony-doped tin oxide, yttrium oxide and zirconium oxide.

If the high refractive index particles are too small, the particles are deteriorated in handleability. If the high refractive index particles are too large, laser light is hardly inhibited from being diffused. Therefore, the range of the average particle diameter of the high refractive index particles is preferably 5 nm to 200 nm, more preferably 5 nm to 100 nm, and further preferably 10 nm to 80 nm.

If the content of the high refractive index particles is too low, the refractive index of the high refractive index layer is hardly increased. If the content of the high refractive index particles is too high, laser light is hardly inhibited from being diffused. Therefore, the range of the content of the high refractive index particles is preferably 50 parts by mass to 200 parts by mass, and more preferably 70 parts by mass to 150 parts by mass based on 100 parts by mass of a binder component.

<Hard Coat Layer>

The resin panels of the first embodiment and the second embodiment of the present disclosure may each comprise a hard coat layer between the resin layer and the antireflection layer, or between the plastic film and the antireflection layer, in order to provide good scratch resistance of the resin panel.

The hard coat layer preferably contains a curable resin composition as a main component. The curable resin composition is formed into a cured product and then a binder component in the hard coat layer.

The main component means a component that accounts for 50% by mass or more, preferably 70% by mass or more, and more preferably 80% by mass or more of the total solid content of the hard coat layer.

Examples of the curable resin composition of the hard coat layer include a thermosetting resin composition and an ionizing radiation curable resin composition, and an ionizing radiation curable resin composition is preferable.

Examples of the thermosetting resin composition and the ionizing radiation curable resin composition of the hard coat layer include the same as the thermosetting resin compositions and the ionizing radiation curable resin compositions exemplified for the conductive layer and the antireflection layer.

In the case where the ionizing radiation-polymerizable compound is used as the curable resin composition, the ionizing radiation-polymerizable compound of the hard coat layer is preferably larger in number of ionizing radiation-curable functional groups per unit mass than the ionizing radiation-polymerizable compound of the antireflection layer in order to provide good scratch resistance.

The hard coat layer may contain a thermoplastic resin as a binder component in order to provide good processing suitability in curved surface processing or the like.

The hard coat layer may contain inorganic particles in order to enhance hardness.

Examples of the inorganic particles include silica, alumina, zirconia and titania, and silica is preferable.

The range of the average particle diameter of the inorganic particles is preferably 10 nm to 6 μm, and more preferably 30 nm to 5 m. The range of the average particle diameter of the inorganic particles may be 10 nm to 5 μm, or may be 30 nm to 6 m.

The range of the content of the inorganic particles in the hard coat layer is preferably 0.1 parts by mass to 100 parts by mass, more preferably 0.1 parts by mass to 50 parts by mass, more preferably 0.1 parts by mass to 30 parts by mass, and more preferably 1 part by mass to 20 parts by mass based on 100 parts by mass of the cured product of the curable resin composition. The range of the content of the inorganic particles in the hard coat layer may be 1 part by mass to 100 parts by mass, may be 1 part by mass to 50 parts by mass, or may be 1 part by mass to 30 parts by mass based on 100 parts by mass of the cured product of the curable resin composition.

The lower limit of the thickness of the hard coat layer is preferably 1 μm or more, more preferably 2 μm or more, more preferably 3 μm or more, and more preferably 4 μm or more, in order to provide good scratch resistance. The upper limit of the thickness of the hard coat layer is preferably 20 μm or less, more preferably 10 μm or less, more preferably 8 μm or less, more preferably 7 μm or less, and more preferably 5 μm or less, in order to provide good processing suitability of curved surface processing or the like.

An embodiment of a suitable range of the thickness of the hard coat layer is, for example, 1 μm to 20 μm, 1 μm to 10 μm, 1 μm to 8 μm, 1 μm to 7 μm, 1 μm to 5 μm, 2 m to 20 μm, 2 μm to 10 μm, 2 μm to 8 μm, 2 μm to 7 μm, 2 μm to 5 μm, 3 μm to 20 μm, 3 m to 10 μm, 3 μm to 8 μm, 3 μm to 7 μm, 3 μm to 5 μm, 4 μm to 20 μm, 4 μm to 10 μm, 4 m to 8 μm, 4 μm to 7 μm, or 4 μm to 5 m.

<Optical Characteristics>

The infrared light transmittance of each of the resin panels of the first embodiment and the second embodiment of the present disclosure is preferably 75% or more, preferably 85% or more, and more preferably 90% or more. The upper limit of the infrared light transmittance of such each resin panel is not particularly limited, but is usually 99% or less, preferably 97% or less.

The infrared light transmittance preferably falls within the above-described range even if any surface of the resin panel is adopted as the light incident surface.

The light transmittance at a wavelength of 905 nm of each of the resin panels of the first embodiment and the second embodiment of the present disclosure more preferably falls within the above-described range.

Herein, the visible light transmittance, the infrared light transmittance, and the image definition of the resin panel are each the average of found values at 20 points.

The visible light transmittance of each of the resin panels of the first embodiment and the second embodiment of the present disclosure is preferably 20% or less. When the visible light transmittance is 20% or less, not only accuracy of an infrared sensor can be more easily increased, but also an infrared light emitting element and an infrared light receiving element disposed inside such an infrared sensor can be easily made invisible.

The visible light transmittance is preferably 15% or less, more preferably 13% or less, more preferably 11% or less, more preferably 10% or less, more preferably 5% or less, more preferably 3% or less, and more preferably 1% or less. The visible light transmittance can be adjusted by, for example, adding a visible light absorber to a layer constituting the resin panel.

The visible light transmittance preferably falls within the above-described range even if any surface of the resin panel is adopted as the light incident surface.

The visible light transmittance of the resin panel may be more than 20% in order to enhance design. The visible light transmittance of the resin panel may be 60% or more, or may be 80% or more.

Herein, the "visible light transmittance" means the average value of spectral transmittances at wavelengths of 380 nm to 780 nm. The wavelength interval is set to 1 nm in the measurement.

The image definition in transmission at an optical comb width of 0.25 mm, in each of the resin panels of the first embodiment and the second embodiment of the present disclosure, is preferably 65% or more, as measured according to JIS K7374:2007. When the image definition is 65% or more, accuracy of an infrared sensor can be more easily increased.

The image definition is more preferably 70% or more, further preferably 75% or more, and still further preferably 80% or more. The upper limit of the image definition is not particularly limited, but is usually 95% or less.

The image definition preferably falls within the above-described range even if any surface of the resin panel is adopted as the light incident surface.

The image definition in transmission according to JIS K7374:2007, while can be determined with an optical comb width selected, other than 0.25 mm, is preferably determined with an optical comb width of 0.25 mm in order to evaluate irregularities occurring on the surface of the plastic film. If the optical comb width is more than 0.25 mm, the irregularities are hardly reflected on the value of the image definition. If the optical comb width is less than 0.25 mm, small irregularities almost not having any effect on accuracy of an infrared sensor are also reflected on the numerical value.

The light source for the image definition in transmission according to JIS K7374:2007 is visible light. That is, the above-described range of the image definition corresponds to a value measured with visible light. However, visible light has shorter wavelengths and allows for a higher resolution than infrared light, and it can be thus said that, when the image definition in measurement with visible light is high, the image definition in measurement with infrared light is also high. Therefore, it can be said that, when the value of the definition in transmission falls within the above-described range, accuracy of an infrared sensor can be more easily increased. The same can also apply to the value of the variation in light intensity, described later. The same can also apply to evaluation of blurring in a laser pointer in Examples.

The value of the variation in light intensity of each of the resin panels of the first embodiment and the second embodiment of the present disclosure, as measured according to a surface texture measurement method including the following (1) to (4), is preferably 12.0% or less. When the value of the variation in light intensity is 12.0% or less, accuracy of an infrared sensor can be more easily increased.

The value of the variation in light intensity is more preferably 10.0% or less, and further preferably 8.0% or less. The lower limit of the value of the variation in light intensity is not particularly limited, but is usually 5.0% or more.

<<Surface Texture Measurement Method>>

(1) The surface of the plastic film side of the resin panel is defined as a surface to be measured. The surface to be measured of the resin panel is irradiated with illumination light having four linear light regions and dark regions. Before irradiation with illumination light, a black plate is bonded to the surface of the resin layer side of the resin panel with a pressure-sensitive adhesive layer being interposed.

(2) An imager is used to perform focusing on the surface to be measured, thereby providing reflection on the surface to be measured, receiving reflected light having linear light regions and dark regions corresponding to the light regions and the dark regions of the illumination light, and detecting a light intensity distribution of the reflected light on the surface to be measured.

(3) The light intensity distribution of the reflected light on the surface to be measured is segmented into 1100 segmented regions in the longitudinal direction of the linear light regions of the reflected light, and the light intensity at a position away from, by a given value, a position at which the peak value of the light intensity is represented is determined with respect to each of the segmented regions and each of the light regions.

(4) The coefficient of variation of the light intensity in each of the light regions is determined, and the arithmetic average value of the coefficients of variation in the four light regions is calculated.

The surface texture measurement method is more specifically described.

A surface texture measurement apparatus 20 shown in FIG. 4(A) is preferably used as a measurement apparatus. The surface texture measurement apparatus 20 comprises an irradiation part 22 which radiates illumination light L1 having linear light regions and dark regions, to a surface to be measured 21, an imager 25 which performs focusing on the surface to be measured 21 and reflection on the surface to be measured 21, and receives reflected light L2 having linear light regions and dark regions corresponding to light regions and dark regions of the illumination light L1, to detect a light intensity distribution of the reflected light L2 on the surface to be measured 21, a first processing part 26 which determines the light intensity at a position away from, by a given value, a position at which the peak value of the light intensity in the light regions is represented in the light intensity distribution of the reflected light L2 on the surface to be measured 21, and a second processing part 27 which quantifies the variation in the light intensity determined in the first processing part 26.

The irradiation part 22 is formed by directly bonding a mask 24 comprising a metal plate 32 and rectangular openings 31 each penetrating through the metal plate 32, shown in FIG. 4(B), to the following OLED (organic light-emitting diode) light source 23. The mask has a transmissive region including four such rectangular openings 31 as shown in FIG. 4(B), and such a rectangular transmissive region has a length of 65 mm, a line width of 2.0 mm, and a pitch of 4.0 mm. Here, the distance between the light source 23 and the surface to be measured 21 of the resin panel is 33 cm, and the incident angle of the illumination light radiated from the illumination part is 60°. The distance between the imager 25 and the surface to be measured 21 is 33 cm, and the light receiving angle of the reflected light in the imager 25 is 60°. Light from such a LED light source passes through the mask 24 to irradiate the surface to be measured 21 with the illumination light L1 having linear light regions and dark regions.

The LED light source here used is EELM-SKY-300-W manufactured by Ecorica Inc., and the imager here used is a digital single-lens reflex camera D5600 manufactured by Nicon Corporation. The lens here used is AF-P DX NIKKOR 18-55 mm f/3.5-5.6G VR manufactured by Nicon Corporation. The camera is set with an aperture value of f/22, an exposure time of ⅛ seconds, ISO-100, and a focal length of 55 mm.

A mark is placed by 1 cm in front of the surface to be measured 21, and the imager is used to focus on the mark by autofocusing. The surface to be measured of the resin panel is irradiated with light from the light source with the mask being interposed, and an image of the reflected light on the surface to be measured of the resin panel is taken with the imager.

The image taken with the imager is subjected to determination of the moving average with respect to 50 pixels in each of vertical and lateral directions, binarization with a maximum value/1.3 as the threshold, and noise removal. The cell at the left end of each row is subjected to straight line approximation by a least-square method, and the image is rotated so that the slope of the straight line approximated is zero, to correct a position in the image.

In addition, 1100 pixels in the longitudinal direction of the linear light regions of the reflected light and 500 pixels in the lateral direction of the linear light regions of the reflected light are cut from the center of the image taken by the camera.

As shown in FIG. 5, segmentation to 1100 segmented regions in a longitudinal direction (D1) of the linear light regions of the reflected light is performed. FIG. 6 is a graph showing a light intensity distribution of the reflected light in each of segmented regions A1 to A1100, and shows an example in determination of the light intensity at a position away from, by a given value, a position at which the peak value of the light intensity in the light regions is represented.

The light intensity is the average value of the luminance values in 8 bit (256 gradations) of RGB.

As shown in FIG. 5, the reflected light L2 has four linear light regions 41 (41*a* to 41*d*) corresponding to the linear light regions and dark regions of the illumination light L1, and thus positions q0, r0, s0, and t0 representing peak values $P1_j$ to $P4_j$ of the light intensities are first determined with respect to the respective linear light regions 41*a* to 41*d* in the light intensity distribution of the reflected light, shown in FIG. 6. The light intensity distribution in each of the linear light regions 41*a* to 41*d* is segmented to a left-hand light intensity distribution 43 and a right-hand light intensity distribution 44 with each of the peak values $P1_j$ to $P4_j$ of the light intensities, as a boundary. Next, a light intensity value $Q1_k$ of a position away from, by a given value q1 ((=20 pixels)), the position q0 at which the peak value $P1_j$ of the light intensity is represented is determined in the left-hand light intensity distribution 43 in the linear light region 41*a*. Similarly, a light intensity value $Q2_k$ of a position away from, by a given value q2, the position q0 at which the peak value $P1_j$ of the light intensity is represented is determined in the right-hand light intensity distribution 44 in the linear light region 41*a*. Next, light intensity values $Q1_k$ to $Q2_k$, $R1_k$ to $R2_k$, $S1_k$ to $S2_k$, and $T1_k$ to $T2_k$ of positions away from, by given values q1 to q2, r1 to r2, s1 to s2, and t1 to t2, the positions q0, r0, s0, and t0 at which the peak values $P1_j$ to $P4_j$ of the light intensities are represented are determined with respect to each left-hand light intensity distribution 43 and each right-hand light intensity distribution 44 in the linear light regions 41*a* to 41*d*. Furthermore, light intensity values $Q1_k$ to $Q2_k$, $R1_k$ to $R2_k$, $S1_k$ to $S2_k$, and $T1_k$ to $T2_k$ (k=1 to 1100) are also determined with respect to each left-hand light intensity distribution 43 and each right-hand light intensity distribution 44 in the segmented regions A1 to A1100 and the linear light regions 41*a* to 41*d*.

Here, the light intensity distribution of the reflected light on the surface to be measured, detected in the imager, is subjected to smoothing processing in advance for the purpose of determination of a position at which the peak value of the light intensity in each light region is represented. Specifically, the moving average with respect to 50 pixels in the light intensity distribution in each segmented region is determined, and a position at which the maximum of the light intensity in each linear light region in a light intensity distribution after moving average processing is represented is defined as a position at which the peak value of the light intensity in such each linear light region is represented.

The position away from, by 20 pixels, the position at which the peak value of the light intensity is represented is here a position at which the light intensity corresponds to about 50% of a reference value. The reference value is defined by a reference value determined as the arithmetic average value of the peak values of the light intensities determined with respect to each of segmented regions and each of linear light regions in an image of reflected light.

Next, the arithmetic average value and the standard deviation of light intensity values $Q1_k$ (k=1 to 1100) in the respective segmented regions A1 to A1100 are determined with respect to the left-hand light intensity distribution 43 in one linear light region 41*a*, the coefficient of variation is calculated by dividing the standard deviation by the arithmetic average value, and the coefficient of variation is defined as the coefficient of variation in light intensity in the left-hand light intensity distribution 43 in the linear light region 41*a*. The arithmetic average value and the standard deviation of light intensity values $Q2_k$ (k=1 to 1100) in the respective segmented regions A1 to A1100 are determined with respect to the right-hand light intensity distribution 44 in one linear light region 41*a*, the coefficient of variation is calculated by dividing the standard deviation by the arithmetic average value, and the coefficient of variation is defined as the coefficient of variation in light intensity in the right-hand light intensity distribution 44 in the linear light region 41*a*. Similarly, the arithmetic average value and the standard deviation of light intensity values $R1_k$ (k=1 to 1100) in the respective segmented regions A1 to A1100 are determined with respect to the left-hand light intensity distribution 43 in another linear light region 41*b*, the coefficient of variation is calculated by dividing the standard deviation by the arithmetic average value, and the coefficient of variation is defined as the coefficient of variation in light intensity in the left-hand light intensity distribution 43 in the linear light region 41*b*. The arithmetic average value and the standard deviation of light intensity values $R2_k$ (k=1 to 1100) in the respective segmented regions A1 to A1100 are determined with respect to the right-hand light intensity distribution 44 in the linear light region 41*b*, the coefficient of variation is calculated by dividing the standard deviation by the arithmetic average value, and the coefficient of variation is defined as the coefficient of variation in light intensity in the right-hand light intensity distribution 44 in the linear light region 41*b*. The arithmetic average value and the standard deviation of light intensity values $S1_k$ (k=1 to 1100) in the respective segmented regions A1 to A1100 are determined with respect to the left-hand light intensity distribution 43 in another linear light region 41*c*, the coefficient of variation is calculated by dividing the standard deviation by the arithmetic average value, and the coefficient of variation is defined as the coefficient of variation in light intensity in the left-hand light intensity distribution 43 in the linear light region 41*c*. The arithmetic average value and the standard deviation of light intensity values $S2_k$ (k=1 to 1100) in the respective segmented regions A1 to A1100 are determined with respect to the right-hand light intensity distribution 44 in the linear light region 41*c*, the coefficient of variation is calculated by dividing the standard deviation by the arithmetic average value, and the coefficient of variation is defined as the coefficient of variation in light intensity in the right-hand light intensity distribution 24 in the linear light region 21*c*. The arithmetic average value and the standard deviation of light intensity values $T1_k$ (k=1 to 1100) in the respective segmented regions A1 to A1100 are determined with respect to the left-hand light intensity distribution 43 in another linear light region 41*d*, the coefficient of variation is calculated by dividing the standard deviation by the arithmetic average value, and the coefficient of variation is defined as the coefficient of variation in light intensity in the left-hand light intensity distribution 43 in the linear light region 41*d*. The arithmetic average value and the standard deviation of light intensity values $T2_k$ (k=1 to 1100) in the respective segmented regions A1 to A1100 are determined with respect to the right-hand light intensity distribution 44 in the linear light region 41*d*, the coefficient of variation is calculated by dividing the standard deviation by the arithmetic average value, and the coefficient of variation is defined as the coefficient of variation in light intensity in the right-hand light intensity distribution 44 in the linear light region 41*d*. Next, the arithmetic average value of the standard deviations of the light intensities in the left-hand light intensity distribution 43 and the right-hand light intensity distribution 44 in each of the linear light regions 41*a* to 41*d* is calculated. The arithmetic average value of the coefficients of variation in light intensity in the left-hand light intensity distribution 43 and the right-hand light intensity distribution 44 in each of the linear light regions 41*a* to 41*d* is calculated. The arithmetic average value of the coefficients of variation in light intensity in the left-hand light intensity distribution 43 and the right-hand light intensity distribution 44 in each of the linear light regions 41*a* to 41*d* is defined as the variation in light intensity.

The resin panels of the first embodiment and the second embodiment may be each sheet-shaped or roll-shaped. A roll-shaped resin panel is preferably used as a sheet which is cut from a roll so as to have a given size.

<Method for Producing Resin Panel of First Embodiment>

A method for producing the resin panel of the first embodiment of the present disclosure comprises the following steps 1-1 and 1-2.

Step 1-1: A step of forming a conductive layer on one surface of a resin layer or a plastic film.

Step 1-2: A step of bonding the resin layer and the plastic film with a pressure-sensitive adhesive layer being interposed therebetween.

Any other step, for example, a step of decorating design or the like and/or a step of forming an electrode terminal may be comprised in addition to steps 1-1 and 1-2.

In step 1-1, the conductive layer can be formed by a general procedure such as application, printing, transfer, laser lithography, and/or deposition. In the case where the conductive layer is formed into a pattern, a general procedure for patterning such as etching may be used in combination.

In step 1-2, bonding may be carried out by hand working or may be carried out with a bonding apparatus such as a laminator.

Step 1-2 is to be carried out such that the conductive layer is positioned between the resin layer and the plastic film.

In order to provide good bonding workability in step 1-2, a laminated body comprising a pressure-sensitive adhesive layer on the plastic film is preferably produced before step 1-2.

In the case where a functional layer such as an antireflection layer is comprised on the resin layer and the plastic film, the functional layer is preferably formed on the resin layer and/or the plastic film before step 1-1 or step 1-2. The resin panel is sometimes deformed to a given shape such as a curved surface shape after step 1-2. The functional layer is difficult to uniformly form on the resin panel thus deformed. In this regard, the functional layer can be formed before step 1-1 or step 1-2 to not only easily uniform the function of the functional layer in a surface of the resin panel, but also enhance production efficiency.

After step 1-2, an autoclave treatment is preferably carried out. Even if air bubbles are incorporated between layers of the resin panel in step 1-1, the autoclave treatment can easily remove the air bubbles and thus easily enhance accuracy of an infrared sensor. The autoclave treatment is preferably performed under the following conditions.

<Conditions of Autoclave Treatment>

Pressure: range of 0.5 MPa to 1.5 MPa

Temperature: range of 50 °C to 100 °C.

Time: range of 30 minutes to 90 minutes

<Method for Producing Resin Panel of Second Embodiment>

A method for producing the resin panel of the second embodiment of the present disclosure includes steps 2-1 and 2-2 below.

Step 2-1: A step of obtaining a film for insert molding, in which a conductive layer is formed on one surface of a plastic film. In the step, the film for insert molding is disposed in a mold so that the conductive layer faces the inside of the mold.

Step 2-2: A step of clamping the mold, and injecting a composition for forming a resin layer into the mold, to closely attach the conductive layer of the film for insert molding and a resin layer.

Any other step, for example, a step of decorating design or the like and/or a step of forming an electrode terminal may be comprised in addition to steps 2-1 and 2-2.

In step 2-1, the conductive layer can be formed by a general procedure such as application, printing, transfer, laser lithography, and/or deposition. In the case where the conductive layer is formed into a pattern, a general procedure for patterning such as etching may be used in combination.

In the case where a functional layer such as an antireflection layer is comprised on the plastic film, the functional layer is preferably formed on the plastic film before step 2-1. The functional layer can be formed before step 2-1 to not only easily uniform the function of the functional layer in a surface of the resin panel, but also enhance production efficiency.

[Infrared Sensor]

The infrared sensor of the present disclosure comprises an infrared light emitting element, an infrared light receiving element, and a protective cover disposed in front of the infrared light emitting element and the infrared light receiving element, the protective cover being the above-described resin panel of the first embodiment or the second embodiment of the present disclosure.

There is also an infrared sensor with a protective cover made of glass as the protective cover. However, the protective cover made of glass not only may be broken by stepping stone or the like, but also has no followability to any curved surface. Therefore, the resin panel of the first embodiment or the second embodiment of the present disclosure is preferably used as the protective cover.

Any infrared light emitting element capable of emitting the infrared laser can be used without particular limitation. The light-emitting center wavelength of the infrared laser is preferably 905 nm. The light-emitting center wavelength of the infrared laser may be any wavelength other than 905 nm, such as 1320 nm and 1550 nm.

Any infrared light receiving element capable of receiving the infrared laser can be used without particular limitation.

The infrared light emitting element and the infrared light receiving element are preferably disposed in a casing.

It is preferable that the casing have a window part, and that infrared light be able to be emitted and received through the window part. The window part is preferably provided with a protective cover.

The protective cover is disposed in front of the infrared light emitting element and the infrared light receiving element. The infrared sensor of the present disclosure is required to use the above-described resin panel of the present disclosure as the protective cover.

When the above-described resin panel of the present disclosure is used as the protective cover, accuracy of the infrared sensor can be increased.

The resin panel is preferably disposed in the infrared sensor so that the surface of the plastic film of the resin panel faces the infrared light emitting element and infrared light receiving element side.

The infrared sensor is useful as a distance sensor (LiDAR) and can be used as a sensor for driving a vehicle such as an automobile or a train, or a sensor for an automatic cleaner, for example.

[Article]

The article of the present disclosure is an article equipped with the infrared sensor of the present disclosure.

Examples of the article equipped with the infrared sensor include an automobile, a cleaner, a face authentication camera, a remote controller for home electrical appliances, and a healthcare product. Examples of the healthcare product include a thermometer, a body temperature distribution measuring instrument, and a vein detector.

EXAMPLES

Hereinafter, the present disclosure will be specifically described with reference to Examples and Comparative Examples. However, the present disclosure is not limited to modes described in Examples.

1. Measurement and Evaluation

The following measurement and evaluation were carried out on resin panels obtained in Examples and Comparative Examples. The measurement and evaluation were performed at a temperature of 23±5 °C and a relative humidity of 40% to 65% except for any case particularly noted. Subject samples were exposed to the atmosphere for 30 minutes to 60 minutes before the measurement and evaluation were carried out. The results are shown in any of Tables 1 to 3.

1-1. Image Definition

The image definition in transmission at an optical comb width of 0.25 mm in each of the resin panels of Examples and Comparative Examples was measured according to JIS K7374:2007. Both measurement with the plastic film as the light incident surface and measurement with the resin layer as the light incident surface were performed. The measurement apparatus used was item number “GP-100S” from NIKKA Densok Limited.

1-2. Variation in Light Intensity

According to the description in the main text of the specification, the variation in light intensity in each of the resin panels of Examples and Comparative Examples was measured.

1-3. Infrared Light Transmittance

The light transmittance (infrared light transmittance) at a wavelength of 905 nm of each of the resin panels of Examples and Comparative Examples was measured with an ultraviolet-visible spectrophotometer provided with the following function and specification. Both measurement with the plastic film as the light incident surface and measurement with the resin layer as the light incident surface were performed.

<Function and Specification>

Model; ultraviolet-visible spectrophotometer (model number: V-670) manufactured by JASCO Corporation Attachment unit; integrating sphere unit (item number: ISN-723 manufactured by JASCO Corporation)

Light source; deuterium lamp (190 nm to 350 nm), halogen lamp (330 nm to 2700 nm)

Wavelength interval in measurement; 1 nm

Spot diameter in measurement: 2 mm to 20 mm 1-4. Blurring of Laser Pointer

The plastic film side of each of the resin panels of Examples and Comparative Examples was irradiated with laser from a laser pointer under a dark room environment (wavelength:635 nm to 690 nm, output: 3000 mW, incident angle: 0 degrees (0 degrees representing the normal direction of the resin panel.), distance between the laser pointer and the resin panel: 500 mm). The dark room environment means an environment at an illuminance of 50 Lx or less. A reference was produced by bonding a black plate having a thickness of 100 μm to the plastic film used in Example 1-1 with a pressure-sensitive adhesive layer having a thickness of 50 μm being interposed, and the plastic film side of the reference was irradiated with the laser pointer. The pressure-sensitive adhesive layer here used was trade name "PDS-1" from Lintec Corporation. The black plate here used was trade name "Lumirror X-30" from Toray Industries, Inc.

The state of reflection of the laser pointer to the plastic film in each of Examples and Comparative Examples based on the state of reflection of the laser pointer to the plastic film of the reference was evaluated according to the following criteria. The number of raters was 12 persons in total of 4 persons with respect to each generation of thirties, forties and fifties. A case in which the image definition is 70% or more and the variation in light intensity is 12.5 or less tend to be evaluated as "A" in terms of blurring of the laser pointer.

S: determined by all 12 persons that the size of the laser pointer is the same as that of the reference.

A: determined by 10 or more persons that the size of the laser pointer is the same as that of the reference.

B: determined by 7 to 9 persons that the size of the laser pointer is the same as that of the reference.

C: determined by 6 or less persons that the size of the laser pointer is the same as that of the reference.

1-5. Mandrel Test

A mandrel test of a laminated body of Reference Example was performed according to a cylindrical mandrel method of JIS K5600-5-1:1999. Evaluated were the presence of cracking in the case of a mandrel size of 20 mm and the presence of cracking in the case of a mandrel size of 10 mm. The evaluation was made with the laminated body wound around a mandrel bar so that the pressure-sensitive adhesive layer was located outward. No cracking occurring in the case of 10 mm is determined to mean good bending resistance. The test apparatus here used was the Type 1 test apparatus of JIS. The test environment and drying conditions of each sample were according to the regulations of JIS.

2. Preparation of Application Liquid 2-1. Preparation of Silver Fiber-Containing Composition The reducing agent here used was ethylene glycol (EG) and the agent serving as both a form control agent and a protective colloid agent was polyvinylpyrrolidone (PVP: average molecular weight 1300000, manufactured by Sigma-Aldrich Co. LLC), and the following nucleus formation step and particle growth step were separated to perform particle formation, thereby preparing a silver fiber-containing composition.

<Nucleus Formation Step>

While 100 mL of an EG liquid retained at 160 °C in a reaction vessel was stirred, 2.0 mL of an EG solution of silver nitrate (silver nitrate concentration: 1.0 mol/L) was added at a constant flow rate over one minute. Subsequently, silver ions were reduced to form nuclear particles of silver with retention at 160 °C for 10 minutes. The reaction liquid exhibited yellow due to surface plasmon absorption of nano-sized silver fine particles, and it was confirmed that silver ions were reduced to form silver fine particles (nuclear particles). Subsequently, 10.0 mL of an EG solution of PVP (PVP concentration: $3.0\times10^{-1}$ mol/L) was added at a constant flow rate over 10 minutes.

<Particle Growth Step>

The reaction liquid containing the nuclear particles after completion of the nucleus formation step was retained at 160 °C with stirring, and 100 mL of an EG solution of silver nitrate (silver nitrate concentration: $1.0\times10^{-1}$ mol/L) and 100 mL of an EG solution of PVP (PVP concentration: $3.0\times10^{-1}$ mol/L) were added at constant flow rates over 120 minutes according to a double jet method. In the particle growth step, the reaction liquid was collected every 30 minutes and confirmed with an electron microscope, and then the nuclear particles formed in the nucleus formation step were grown to wire-shaped particles according to a lapse of time and no new fine particles were observed to be generated in the particle growth step. The fiber diameter and the fiber length of a silver fiber finally obtained were measured, and the fiber diameter and the fiber length of the silver fiber were 11 nm and 9.5 m respectively. The fiber diameter of the silver fiber was obtained by measuring the fiber diameters of 50 of such conductive metal fibers at 1000× to 500000× with a scanning transmission electron microscope (STEM) to determine the average value of the fiber diameters of 50 of such conductive metal fibers. The fiber length of the silver fiber was obtained by measuring the fiber lengths of 50 of such conductive metal fibers at 1000× to 500000× with a scanning electron microscope (SEM) to determine the average value of the fiber lengths of 50 of such conductive metal fibers. STEM and SEM here used were each trade name "SU9000" from Hitachi High-Tech Corporation.

<Desalting and Water Washing Step>

The reaction liquid after completion of the particle growth step was cooled to room temperature, and thereafter was subjected to a desalting and water washing treatment with an ultrafiltration membrane having a molecular weight cut off of 0.2 μm and also the solvent was replaced with ethanol. The amount of the liquid was decreased to 100 mL by concentration to obtain a silver fiber dispersion liquid. Finally, the liquid was diluted with ethanol and anone so that the silver fiber concentration was 0.10% by mass and the solvent ratio of anone after dilution was 30% by mass, thereby obtaining a silver fiber-containing composition.

2-2. Preparation of Composition for Cover Resin

A composition for a cover resin was obtained by blending each component so that the following compositional ratio was achieved.

<Composition for Cover Resin>

Mixture of pentaerythritol triacrylate and pentaerythritol tetraacrylate (product name "KAYARAD-PET-30", manufactured by Nippon Kayaku Co., Ltd.): 5 parts by mass Polymerization initiator (product name "Irgacurel84", manufactured by BASF Japan Ltd.): 0.25 parts by mass Reaction inhibitor: 0.2 parts by mass (Tetrazole-based compound)

Methyl ethyl ketone: 70 parts by mass

Cyclohexanone: 24.75 parts by mass

3. Production of Resin Panel of First Embodiment

Example 1-1

A polycarbonate resin plate having a thickness of 2 mm (item number "PC1600" from C.I. TAKIRON Corporation) was provided as a resin layer.

A pattern-shaped conductive layer was formed on one surface of the resin layer by etching copper by photolithography after film formation. Such steps thus provided laminated body 1 comprising the pattern-shaped conductive layer on the resin layer.

The conductive layer is made of copper. The conductive layer has a grid shape having a line width of 50 μm and a pitch of 500 μm, and has a thickness of 30 m. The area ratio of the conductive layer based on the total area of the resin layer is 10%.

Thereafter, a biaxially stretched polyethylene terephthalate film having a thickness of 25 μm was provided as a plastic film. The plastic film here used has a Young's modulus of 1.0 GPa as measured in conditions described in the text of the description.

A pressure-sensitive adhesive layer formed from an acrylic pressure-sensitive adhesive was transferred onto one surface of the plastic film, thereby forming a pressure-sensitive adhesive layer having a thickness of 150 m. Such steps thus provided laminated body 2 comprising the pressure-sensitive adhesive layer on the plastic film.

A surface of the conductive layer of laminated body 1 and a surface of the pressure-sensitive adhesive layer of laminated body 2 were allowed to face to each other, to bond laminated body 1 and laminated body 2, thereby obtaining a resin panel of Example 1-1. The resin panel of Example 1-1 comprises the resin layer, the conductive layer, the pressure-sensitive adhesive layer, and the plastic film in this order. The size and shape of the resin panel of Example 1-1 corresponded to a sheet shape of 50 mm×100 mm. The size and shape in each of other Examples and Comparative Examples of the first embodiment also corresponded to a sheet shape of 50 mm×100 mm.

[Example 1-2, 1-4 to 1-6], [Comparative Examples 1-1 and 1-2]

Each of resin panels of Example 1-2, 1-4 to 1-6, and Comparative Examples 1-1 and 1-2 was obtained in the same manner as in Example 1-1 except that the thickness of the plastic film, the thickness of the pressure-sensitive adhesive layer, and the thickness of the conductive layer were values in Table 1. The plastic film here used had a Young's modulus of 1.0 GPa as measured in conditions described in the text of the description.

Example 1-3

A polycarbonate resin plate having a thickness of 2 mm (item number "PC1600" from C.T TAKIRON Corporation) was provided as a resin layer.

Thereafter, a biaxially stretched polyethylene terephthalate film having a thickness of 50 μm was provided as a plastic film. The plastic film here used had a Young's modulus of 1.0 GPa as measured in conditions described in the text of the description.

A silver fiber-containing composition was directly applied to the whole surface of one surface of the plastic film so that the amount of attachment thereof was 30 mg/m$^2$. Thereafter, dry air at 50 °C was allowed to flow through the silver fiber-containing composition applied, at a flow rate of 0.5 m/s for 15 seconds, and furthermore dry air at 70 °C was then allowed to flow therethrough at a flow rate of 10 m/s for 30 seconds, to evaporate a dispersion medium in the silver fiber-containing composition, thereby directly disposing a silver fiber on the plastic film.

Thereafter, the composition for a cover resin was applied so as to cover the silver fiber, thereby forming a coating film. Then, dry air at 50 °C was allowed to flow through the coating film formed, at a flow rate of 0.5 m/s for 15 seconds, and furthermore dry air at 70 °C was allowed to flow therethrough at a flow rate of 10 m/s for 30 seconds, to evaporate the solvent in the coating film, and the coating film was cured by irradiation with ultraviolet light so that the cumulative amount of light was 100 mJ/cm$^2$, thereby forming a cover resin having a thickness of 100 nm. These steps thus provided a laminated body comprising a conductive layer on the plastic film.

Thereafter, a pressure-sensitive adhesive layer formed from an acrylic pressure-sensitive adhesive was transferred onto the conductive layer, thereby forming a pressure-sensitive adhesive layer having a thickness of 150 μm. Such steps thus provided laminated body 3 comprising the conductive layer and the pressure-sensitive adhesive layer on one surface of the plastic film.

The resin layer and a surface of the pressure-sensitive adhesive layer of laminated body 3 were allowed to face to each other, and bonded, thereby obtaining a resin panel of Example 1-3. The resin panel of Example 1-3 comprises the resin layer, the pressure-sensitive adhesive layer, the conductive layer, and the plastic film in this order.

Comparative Example 1-3

A resin panel of Comparative Example 1-3 was obtained in the same manner as in Example 1-3 except that the thickness of the plastic film, the thickness of the pressure-sensitive adhesive layer, and the thickness of the conductive layer were values in Table 1. The plastic film here used had a Young's modulus of 1.0 GPa as measured in conditions described in the text of the description.

In Tables 1 and 2, each upper row and each lower row with respect to each of the image definition and the infrared light transmittance respectively show each value with the resin layer adopted as the light incident surface and each value with the plastic film adopted as the light incident surface.

TABLE 1

| | Example | | | | | | Comparative Example | | |
|---|---|---|---|---|---|---|---|---|---|
| | 1-1 | 1-2 | 1-3 | 1-4 | 1-5 | 1-6 | 1-1 | 1-2 | 1-3 |
| Thickness of pressure-sensitive adhesive layer of expression (1) [μm] | 150 | 10 | 150 | 50 | 100 | 200 | 10 | 10 | 10 |
| Thickness of plastic film [μm] | 25 | 50 | 50 | 25 | 25 | 25 | 25 | 25 | 25 |
| Young's modulus of plastic film [GPa] | 1.0 | 1.0 | 1.0 | 1.0 | 1.0 | 1.0 | 1.0 | 1.0 | 1.0 |
| Value of T × $Y^3$ of expression (2) | 25.0 | 50.0 | 50.0 | 25.0 | 25.0 | 25.0 | 25.0 | 25.0 | 25.0 |
| Area ratio of conductive layer [%] | 10 | 10 | 100 | 10 | 10 | 10 | 10 | 10 | 100 |

TABLE 1-continued

| | Example | | | | | | Comparative Example | | |
|---|---|---|---|---|---|---|---|---|---|
| | 1-1 | 1-2 | 1-3 | 1-4 | 1-5 | 1-6 | 1-1 | 1-2 | 1-3 |
| Thickness of conductive layer [μm] | 30 | 30 | 0.1 | 30 | 30 | 30 | 30 | 10 | 0.1 |
| Image definition (%) | 75 | 70 | 85 | 75 | 75 | 80 | 50 | 65 | 65 |
| | 75 | 70 | 85 | 75 | 75 | 80 | 50 | 65 | 65 |
| Variation in light intensity | 9.0 | 10.5 | 6.5 | 10.5 | 10.0 | 9.5 | 19.0 | 12.5 | 11.0 |
| Infrared light | 89.5 | 89.6 | 90.5 | 89.6 | 89.5 | 89.4 | 89.4 | 89.5 | 90.3 |
| transmittance [%] | 89.5 | 89.6 | 90.5 | 89.6 | 89.5 | 89.4 | 89.4 | 89.5 | 90.3 |
| Blurring | A | S | S | A | A | A | C | B | B |

[Examples 1-7 to 1-14], [Comparative Example 1-4]

Each of resin panels of Examples 1-7 to 1-14 and Comparative Example 1-4 was obtained in the same manner as in Example 1-1 except that the thickness of the plastic film, the thickness of the pressure-sensitive adhesive layer, and the thickness of the conductive layer were values in Table 2. The plastic film here used had a Young's modulus of 1.5 GPa as measured in conditions described in the text of the description. The reason why the Young's modulus of the plastic film in each of Example 1-7 and the like is higher than that of the plastic film in Example 1-1 is because the plastic film in each of Example 1-7 and the like is higher in draw ratio than the plastic film in Example 1-1.

Example 1-15

A resin panel of Example 1-15 was obtained in the same manner as in Example 1-3 except that the thickness of the plastic film, the thickness of the pressure-sensitive adhesive layer, and the thickness of the conductive layer were values in Table 2. The plastic film here used had a Young's modulus of 1.5 GPa as measured in conditions described in the text of the description. The reason why the Young's modulus of the plastic film in Example 1-15 is higher than that of the plastic film in Example 1-1 is because the plastic film in Example 1-15 is higher in draw ratio than the plastic film in Example 1-1.

Examples 1-16 and 1-17

Each of resin panels of Examples 1-16 and 1-17 was obtained in the same manner as in Example 1-1 except that the thickness of the plastic film, the thickness of the pressure-sensitive adhesive layer, and the thickness of the conductive layer were values in Table 2. The plastic film here used had a Young's modulus of 4.0 GPa as measured conditions described in the text of the description. The reason why the Young's modulus of the plastic film in each of Example 1-16 and the like is higher than that of the plastic film in Example 1-1 is because the plastic film in each of Example 1-16 and the like is higher in draw ratio than the plastic film in Example 1-1.

TABLE 2

| | Example | | | | | | | | | | | Comparative Example |
|---|---|---|---|---|---|---|---|---|---|---|---|---|
| | 1-7 | 1-8 | 1-9 | 1-10 | 1-11 | 1-12 | 1-13 | 1-14 | 1-15 | 1-16 | 1-17 | 1-4 |
| Thickness of pressure-sensitive adhesive layer of expression (1) [μm] | 10 | 10 | 10 | 10 | 10 | 5 | 5 | 5 | 10 | 100 | 100 | 10 |
| Thickness of plastic film [μm] | 25 | 15 | 10 | 25 | 10 | 25 | 15 | 10 | 25 | 100 | 125 | 8 |
| Young's modulus of plastic film [GPa] | 1.5 | 1.5 | 1.5 | 1.5 | 1.5 | 1.5 | 1.5 | 1.5 | 1.5 | 4.0 | 4.0 | 1.5 |
| Value of $T \times Y^3$ of expression (2) | 84.4 | 50.6 | 33.8 | 84.4 | 33.8 | 84.4 | 50.6 | 33.8 | 84.4 | 6400.0 | 8000.0 | 27.0 |
| Area ratio of conductive layer [%] | 10 | 10 | 10 | 10 | 10 | 30 | 30 | 30 | 100 | 10 | 10 | 10 |
| Thickness of conductive layer [μm] | 30 | 30 | 30 | 10 | 10 | 30 | 30 | 30 | 0.1 | 30 | 30 | 30 |
| Image definition (%) | 75 | 75 | 70 | 80 | 75 | 75 | 75 | 75 | 75 | 80 | 80 | 65 |
| | 75 | 75 | 70 | 80 | 75 | 75 | 75 | 75 | 75 | 80 | 80 | 65 |
| Variation in light intensity | 12.0 | 12.0 | 12.5 | 10.0 | 10.5 | 12.5 | 11.5 | 12.0 | 10.0 | 9.5 | 9.5 | 13.5 |
| Infrared light | 89.5 | 89.6 | 89.6 | 89.5 | 89.5 | 89.5 | 89.5 | 89.5 | 89.5 | 89.5 | 89.5 | 89.4 |
| transmittance [%] | 89.5 | 89.6 | 89.6 | 89.5 | 89.5 | 89.5 | 89.5 | 89.5 | 89.5 | 89.5 | 89.5 | 89.4 |
| Blurring | S | S | A | S | A | S | A | A | S | S | S | C |

As clear from Tables 1 and 2, it can be confirmed that each of the resin panels of Examples, satisfying the expression (1) or the expression (2), cause less blurring of a laser pointer and allow for good accuracy of an infrared sensor.

Reference Example 1

A laminated body that was the same as "laminated body 3" being an intermediate material in Example 1-3 was produced as a laminated body of Reference Example 1. The laminated body of Reference Example 1 comprises the plastic film, the conductive layer and the pressure-sensitive adhesive layer in this order. The plastic film of the laminated body of Reference Example 1, here used, had a thickness of 50 μm, and had a Young's modulus of 1.0 GPa as measured in conditions described in the text of the description.

Reference Examples 2 to 7

Each of laminated bodies of Reference Examples 2 to 7 was produced in the same manner as in Reference Example 1 except that the Young's modulus and the thickness of the plastic film were changed to values described in Table 3.

TABLE 3

| | Reference Examples | | | | | | |
|---|---|---|---|---|---|---|---|
| | 1 | 2 | 3 | 4 | 5 | 6 | 7 |
| Y: Young's modulus of plastic film [GPa] | 1.0 | 2.0 | 8.0 | 8.0 | 10.0 | 12.0 | 12.0 |
| T: Thickness of plastic film [μm] | 50 | 50 | 50 | 80 | 50 | 50 | 80 |
| Value of T × $Y^3$ | 50 | 400 | 25600 | 40960 | 50000 | 86400 | 138240 |
| Mandrel size [mm] | 10 20 | 10 20 | 10 20 | 10 20 | 10 20 | 10 20 | 10 20 |
| Presence of cracking | No No | No No | No No | No No | Yes No | Yes Yes | Yes Yes |

It can be confirmed from the results in Table 3 that a plastic film having a Young's modulus of 8.0 GPa or less or a plastic film having a value of T×$Y^3$ of 41000 or less does not cause cracking even in the case of a mandrel size of 10 mm and is excellent in bending resistance.

4. Production of Resin Panel of Second Embodiment

Example 2-1

A polycarbonate film having a thickness of 50 μm was provided as a plastic film. The plastic film here used had a Young's modulus of 1.0 GPa as measured in conditions described in the text of the description.

A silver fiber-containing composition was directly applied to the whole surface of one surface of the plastic film so that the amount of attachment thereof was 30 mg/$m^2$. Thereafter, dry air at 50 °C was allowed to flow through the silver fiber-containing composition applied, at a flow rate of 0.5 m/s for 15 seconds, and furthermore dry air at 70 °C was then allowed to flow therethrough at a flow rate of 10 m/s for 30 seconds, to evaporate a dispersion medium in the silver fiber-containing composition, thereby directly disposing a silver fiber on the plastic film.

Thereafter, the composition for a cover resin was applied so as to cover the silver fiber, thereby forming a coating film. Then, dry air at 50 °C was allowed to flow through the coating film formed, at a flow rate of 0.5 m/s for 15 seconds, and furthermore dry air at 70 °C was allowed to flow therethrough at a flow rate of 10 m/s for 30 seconds, to evaporate the solvent in the coating film, and the coating film was cured by irradiation with ultraviolet light so that the cumulative amount of light was 100 mJ/$cm^2$, thereby forming a cover resin having a thickness of 100 nm. These steps thus provided a film for insert molding, the film comprising a conductive layer on the plastic film.

Thereafter, the film for insert molding was disposed in one of paired molds for injection molding. The film for insert molding was disposed in the mold so that the conductive layer faced the inside of the mold.

Thereafter, the mold was clamped, and a composition for forming a resin layer (polycarbonate resin 100% by mass) was injected into the mold, to closely attach the conductive layer of the film for insert molding and a resin layer, thereby obtaining a resin panel of Example 2-1. The temperature of the resin injected was 290 °C, and the injection pressure was 180 MPa. The resin panel of Example 2-1 comprises the resin layer, the conductive layer, and the plastic film in this order. The size and shape of the resin panel of Example 2-1 corresponded to a sheet shape of 50 mm×100 mm. The size and shape in each of other Examples and Comparative Examples of the second embodiment also corresponded to a sheet shape of 50 mm×100 mm.

Examples 2-2 to 2-4 and Comparative Examples 2-1 to 2-3

Each of resin panels of Examples 2-2 to 2-4 and Comparative Examples 2-1 to 2-3 was obtained in the same manner as in Example 2-1 except that the Young's modulus of the plastic film and the thickness of the plastic film were values in Table 4. The reason why the Young's modulus of the plastic film in each of Example 2-2 and the like is higher than that of the plastic film in Example 2-1 is because the plastic film in each of Example 2-2 and the like is higher in draw ratio than the plastic film in Example 2-1.

TABLE 4

| | Example | | | | Comparative Example | | |
|---|---|---|---|---|---|---|---|
| | 2-1 | 2-2 | 2-3 | 2-4 | 2-1 | 2-2 | 2-3 |
| Thickness of plastic film [μl] | 50 | 50 | 100 | 125 | 10 | 25 | 8 |
| Young's modulus of plastic film [GPa] | 1.0 | 1.5 | 1.5 | 2.5 | 1.0 | 1.0 | 1.5 |
| Value of $T \times Y^3$ of expression (3) | 50.0 | 168.8 | 337.5 | 1953.1 | 10.0 | 25.0 | 27.0 |
| Area ratio of conductive layer [%] | 100 | 100 | 100 | 100 | 100 | 100 | 100 |
| Thickness of conductive layer [μm] | 0.1 | 0.1 | 0.1 | 0.1 | 0.1 | 0.1 | 0.1 |
| Image definition (%) | 85 | 85 | 85 | 85 | 55 | 65 | 70 |
| | 85 | 85 | 85 | 85 | 55 | 65 | 70 |
| Variation in light intensity | 6.5 | 9.0 | 8.5 | 8.5 | 13.0 | 12.0 | 12.5 |
| Infrared light | 90.5 | 90.2 | 90.1 | 90.1 | 89.5 | 89.7 | 90.1 |
| transmittance [%] | 90.5 | 90.2 | 90.1 | 90.1 | 89.5 | 89.7 | 90.1 |
| Blurring | A | S | S | S | C | B | B |

As clear from Table 4, it can be confirmed that each of the resin panels of Examples, satisfying the expression (3), cause less blurring of a laser pointer and allow for good accuracy of an infrared sensor.

The respective differences in thickness in the conductive fiber-containing layer of each of Examples of the first embodiment and in the conductive fiber-containing layer of each of Examples of the second embodiment were measured by the procedure described in the text of the description, and were each 50 nm or less.

REFERENCE SIGNS LIST

1: resin layer
2: conductive layer
3: pressure-sensitive adhesive layer
4: plastic film
5: antireflection layer
10: resin panel

The invention claimed is:

1. A resin panel for an infrared sensor, the resin panel comprising a resin layer and a plastic film, as well as comprising a conductive layer between the resin layer and the plastic film, and satisfying the following expression (3):

$$30 \leq T \times Y^3 \quad (3)$$

wherein "T" represents a thickness (unit: "μm") of the plastic film, and "Y" represents a Young's modulus (unit: "GPa") of the plastic film.

2. The resin panel for an infrared sensor according to claim 1, wherein $T \times Y^3$ in the expression (3) is in a range from 30 to 50000.

3. The resin panel for an infrared sensor according to claim 1, wherein the conductive layer is formed into a pattern.

4. The resin panel for an infrared sensor according to claim 3, wherein a thickness of the conductive layer is in a range from 2 μm to 30 μm.

5. The resin panel for an infrared sensor according to claim 1, wherein the conductive layer is formed on a whole surface of the resin panel.

6. The resin panel for an infrared sensor according to claim 5, wherein a thickness of the conductive layer is in a range from 10 nm to 300 nm.

7. The resin panel for an infrared sensor according to claim 5, wherein the conductive layer is a conductive fiber-containing layer, and a difference in thickness of the conductive fiber-containing layer is 50 nm or less.

8. The resin panel for an infrared sensor according to claim 1, wherein a thickness of the resin layer is in a range from 0.5 mm to 5.0 mm.

9. The resin panel for an infrared sensor according to claim 1, comprising an antireflection layer on at least one of a surface of the resin layer, the surface being on the other side than the side provided with the plastic film, and a surface of the plastic film, the surface being on the other side than the side provided with the resin layer.

10. The resin panel for an infrared sensor according to claim 1, wherein the resin layer has a curved surface having a radius of curvature of 1000 mm or more.

11. The resin panel for an infrared sensor according to claim 1, wherein the resin panel has a light transmittance at a wavelength of 905 nm of 75% or more.

12. The resin panel for an infrared sensor according to claim 1, wherein an image definition in transmission at an optical comb width of 0.25 mm, in the resin panel, is 65% or more, as measured according to JIS K7374:2007.

13. An infrared sensor comprising an infrared light emitting element, an infrared light receiving element, and a protective cover disposed in front of the infrared light emitting element and the infrared light receiving element, wherein the protective cover is the resin panel for an infrared sensor according to claim 1.

* * * * *